(12) United States Patent
Miyata et al.

(10) Patent No.: US 9,760,004 B2
(45) Date of Patent: Sep. 12, 2017

(54) RADIATION-SENSITIVE RESIN COMPOSITION AND RESIST PATTERN-FORMING METHOD

(71) Applicant: JSR CORPORATION, Minato-ku (JP)

(72) Inventors: Hiromu Miyata, Tokyo (JP); Hayato Namai, Tokyo (JP); Masafumi Hori, Tokyo (JP)

(73) Assignee: JSR CORPORATION, Minato-ku (JP)

( * ) Notice: Subject to any disclaimer, the term of this patent is extended or adjusted under 35 U.S.C. 154(b) by 0 days.

(21) Appl. No.: 14/502,024

(22) Filed: Sep. 30, 2014

(65) Prior Publication Data

US 2015/0093703 A1    Apr. 2, 2015

(30) Foreign Application Priority Data

Sep. 30, 2013   (JP) .................. 2013-205725
Sep. 12, 2014   (JP) .................. 2014-187118

(51) Int. Cl.

| | | |
|---|---|---|
| G03F 7/038 | (2006.01) | |
| G03F 7/039 | (2006.01) | |
| G03F 7/004 | (2006.01) | |
| G03F 7/11 | (2006.01) | |
| G03F 7/20 | (2006.01) | |
| G03F 7/32 | (2006.01) | |

(52) U.S. Cl.
CPC .......... *G03F 7/0045* (2013.01); *G03F 7/0042* (2013.01); *G03F 7/0046* (2013.01); *G03F 7/0392* (2013.01); *G03F 7/0397* (2013.01); *G03F 7/11* (2013.01); *G03F 7/2041* (2013.01); *G03F 7/325* (2013.01)

(58) Field of Classification Search
None
See application file for complete search history.

(56) References Cited

U.S. PATENT DOCUMENTS

| | | | | |
|---|---|---|---|---|
| 4,910,122 | A | 3/1990 | Arnold et al. | |
| 8,241,830 | B2 * | 8/2012 | Sato ............... | 430/270.1 |
| 8,580,480 | B2 * | 11/2013 | Asano ............. | C07C 69/653 |
| | | | | 430/270.1 |
| 8,728,706 | B2 * | 5/2014 | Asano ............. | C08F 20/22 |
| | | | | 430/270.1 |
| 9,513,548 | B2 * | 12/2016 | Asano ............. | C08F 20/22 |
| 2012/0028189 | A1 * | 2/2012 | Asano ............. | C07C 69/653 |
| | | | | 430/285.1 |
| 2012/0094234 | A1 * | 4/2012 | Matsuda et al. .... | 430/285.1 |
| 2012/0183908 | A1 * | 7/2012 | Anno et al. ....... | 430/325 |
| 2012/0237875 | A1 * | 9/2012 | Asano ............. | C08F 20/22 |
| | | | | 430/283.1 |
| 2013/0045446 | A1 * | 2/2013 | Sato et al. ....... | 430/285.1 |

FOREIGN PATENT DOCUMENTS

| | | | |
|---|---|---|---|
| JP | 59-93448 | | 5/1984 |
| JP | 5-188598 | | 7/1993 |
| JP | 6-12452 | B2 | 2/1994 |
| JP | 2009-134088 | | 6/2009 |
| JP | 2010-32994 | | 2/2010 |
| JP | 2011-007876 | * | 1/2011 |
| JP | 2011-201810 | * | 10/2011 |
| JP | 2013-178370 | * | 9/2013 |
| JP | 2013-182023 | * | 9/2013 |
| WO | WO 2007/116664 A1 | | 10/2007 |
| WO | 2011-108667 | * | 9/2011 |

OTHER PUBLICATIONS

Machine translation of JP 2013-178370 (Sep. 2013).*
Machine translation of JP 2013-182023 (Sep. 2013).*

* cited by examiner

*Primary Examiner* — Martin Angebranndt
(74) *Attorney, Agent, or Firm* — Oblon, McClelland, Maier & Neustadt, L.L.P.

(57) ABSTRACT

The present invention relates to a radiation-sensitive resin composition that contains: a compound that has a structure represented by the following formula (1); a first polymer that includes a fluorine atom; and a solvent. In the following formula (1), X represents a carbonyl group, a sulfonyl group or a single bond. $Y^+$ represents a monovalent radiation-degradable onium cation. The first polymer preferably has at least one selected from the group consisting of a structural unit represented by the following formula (2a) and a structural unit represented by the following formula (2b). The first polymer preferably includes an alkali-labile group. The first polymer preferably includes an acid-labile group. It is preferred that a radiation-sensitive acid generator is further contained.

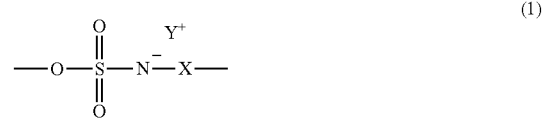

(1)

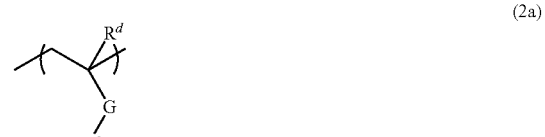

(2a)

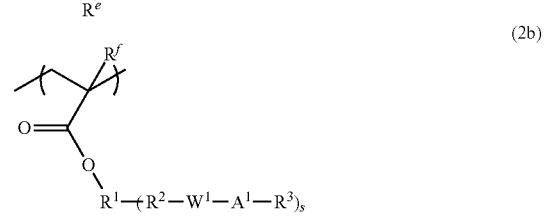

(2b)

12 Claims, No Drawings

RADIATION-SENSITIVE RESIN COMPOSITION AND RESIST PATTERN-FORMING METHOD

CROSS-REFERENCE TO RELATED APPLICATIONS

The present application claims priority to Japanese Patent Application No. 2014-187118, filed on Sep. 12, 2014 which claims priority to Japanese Patent Application No. 2013-205725, filed on Sep. 30, 2013. The contents of these applications are incorporated herein by reference in their entirety.

DISCUSSION OF THE BACKGROUND

The present invention relates to a radiation-sensitive resin composition and a resist pattern-forming method.

BACKGROUND ART

Chemically amplified radiation-sensitive resin compositions used in microfabrication through lithography generate an acid at a light-exposed site upon irradiation with a far ultraviolet ray such as an ArF excimer laser beam, a charged particle ray such as an electron beam, and the like, and chemical reactions catalyzed by the acid allow the difference in dissolution rate in developer solutions to be produced between the light-exposed site and a light-unexposed site, thereby enabling resist patterns to be formed.

In the formation of such resist patterns, a liquid immersion lithography process has been suitably used as a method for forming a finer resist pattern. In the method, an exposure is conducted while allowing a space between an exposure lens and a resist film to be filled with a liquid immersion medium that has a refractive index greater than that of air or an inert gas. The liquid immersion lithography process has advantages that a depth of focus is hardly decreased and additionally superior resolution can be achieved even under increased numerical apertures of the lens.

As a radiation-sensitive resin composition used in such a liquid immersion lithography process, a radiation-sensitive resin composition has been proposed that contains a fluorine atom-containing polymer having superior water repellency, for the purpose of inhibiting the elution of a radiation-sensitive acid generator and the like from a resist film to a liquid immersion medium and improving water draining of the resist film (see PCT International Publication No. WO 2007/116664), and further, a radiation-sensitive resin composition has been proposed that contains a fluorine atom-containing polymer that includes an alkali-labile group, for the purpose of inhibiting development defects and the like caused at a light-unexposed site in association with imparting water repellency to the resist film, the fluorine atom-containing polymer exhibiting water repellency during an exposure through a liquid immersion medium, and generating a carboxy group and exhibiting hydrophilicity during a development with an alkali (see Japanese Unexamined Patent Application, Publication No. 2010-32994). It is reported that the fluorine atom-containing polymer that includes an alkali-labile group enables, for example, development defects such as blob defects caused by adhesion of a residue to be reduced as a result of an increase of affinity for an alkaline developer solution and a rinse agent.

Such radiation-sensitive resin compositions typically contain an acid diffusion control agent for the purpose of improving lithography performances such as resolving ability, rectangularity of a cross-sectional shape and LWR (Line Width Roughness) performance of the resulting resist pattern. Of such acid diffusion control agents, onium salt compounds that include a radiation-degradable onium cation and an anion derived from a weak acid exhibit a loss of acid trapping ability at a light-exposed site and exhibit the acid trapping ability only at a light-unexposed site, and therefore have excellent acid diffusion controllability, leading to a further improvement of the lithography performances. However, the conventional radiation-sensitive resin compositions have a disadvantage that when such onium salt compounds are contained, the storage stability is deteriorated and development defects are formed on the resist pattern. In addition, superior CDU (Critical Dimension Uniformity) performance, depth of focus, exposure latitude, MEEF (Mask Error Enhancement Factor) performance and the like in addition to the aforementioned LWR performance and the like are demanded for the radiation-sensitive resin compositions, and a further improvement of these performances is also demanded. However, the conventional radiation-sensitive resin compositions have not been able to meet these demands.

SUMMARY OF THE INVENTION

The present invention was made in view of the foregoing circumstances, and it is an object of the present invention to provide a radiation-sensitive resin composition that exhibits superior storage stability and superior development defect inhibitory ability, and also exhibits superior LWR performance, CDU performance, resolving ability, rectangularity of a cross-sectional shape, depth of focus, exposure latitude and MEEF performance.

According to an aspect of the invention made for solving the aforementioned problems, a radiation-sensitive resin composition is provided, containing: a compound that has a structure represented by the following formula (1) (hereinafter, may be also referred to as "(A) compound" or "compound (A)"); a first polymer that includes a fluorine atom (hereinafter, may be also referred to as "(B) fluorine atom-containing polymer" or "fluorine atom-containing polymer (B)"); and a solvent (hereinafter, may be also referred to as "(C) solvent" or "solvent (C)"),

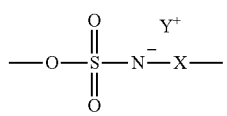

wherein in the formula (1), X represents a carbonyl group, a sulfonyl group or a single bond; and $Y^+$ represents a monovalent radiation-degradable onium cation.

According to another aspect of the invention made for solving the aforementioned problems, a resist pattern-forming method is provided, including: providing a resist film using the radiation-sensitive resin composition according to the aspect of the present invention; exposing the resist film through a liquid immersion medium; and developing the resist film exposed through the liquid immersion medium.

"Organic group" as referred to herein means a group having at least one carbon atom.

Effects of the Invention

According to the radiation-sensitive resin composition and the resist pattern-forming method of the aspects of the present invention, a resist pattern can be formed that exhibits less development defects, reduced LWR and CDU, increased resolving ability, and superior rectangularity of a cross-sectional shape while exhibiting superior storage stability, depth of focus, exposure latitude and MEEF performance. Therefore, these can be suitably used in pattern formation involved in the production of semiconductor devices and the like, in which further progress of miniaturization is expected.

DESCRIPTION OF THE EMBODIMENTS

Radiation-Sensitive Resin Composition

The radiation-sensitive resin composition contains (A) a compound, (B) a fluorine atom-containing polymer and (C) a solvent. The radiation-sensitive resin composition may contain, as a favorable component, a radiation-sensitive acid generator (hereinafter, may be also referred to as "(D) acid generator" or "acid generator (D)"), and a polymer having a content of fluorine atoms less than that of the fluorine atom-containing polymer (B) and including an acid-labile group (hereinafter, may be also referred to as "(E) polymer" or "polymer (E)"). Furthermore, the radiation-sensitive resin composition may contain other optional component(s), within a range not leading to impairment of the effects of the present invention.

Hereinafter, each component will be explained.

(A) Compound

The compound (A) has a structure represented by the following formula (1). According to the radiation-sensitive resin composition, even in a case where the fluorine atom-containing polymer (B) is contained, when the compound (A) is used as an onium salt compound which serves as the acid diffusion control agent, both of superior storage stability and superior development defect inhibitory ability can be attained, and in addition, the LWR performance, the CDU performance, the resolving ability, the rectangularity of a cross-sectional shape, the depth of focus, the exposure latitude and the MEEF performance can be also favorable.

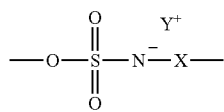
(1)

In the above formula (1), X represents a carbonyl group, a sulfonyl group or a single bond; and $Y^+$ represents a monovalent radiation-degradable onium cation.

Although it is not necessarily clear why the radiation-sensitive resin composition exhibits the effects due to having the aforementioned constitution, the following can be presumed, for example: when a conventional onium salt compound is contained as the acid diffusion control agent, deposition of a hardly soluble salt and the like is unavoidable because of an ion exchange reaction with the fluorine atom-containing polymer (B), etc., whereas in the case of the compound (A), the deposition may be inhibited probably due to adequately reduced basicity attributed to the structure represented by the formula (1) and to steric hindrance around the nitrogen anion, and the like, resulting in an improvement of the storage stability and the development defect inhibitory ability of the radiation-sensitive resin composition; and the like. Moreover, since the compound (A) as the acid diffusion control agent has the specific structure represented by the formula (1) and exhibits adequately high polarity, a diffusion length of the acid generated from the acid generator and the like in the resist film can be adequately reduced. It is considered that the radiation-sensitive resin composition exhibits improved LWR performance, CDU performance, resolving ability, rectangularity of a cross-sectional shape, depth of focus, exposure latitude and MEEF performance owing to the inhibition of the deposition and the control of the diffusion length of the acid, as described above.

As X, a carbonyl group is preferred in light of a further improvement of the storage stability and the development defect inhibitory ability of the radiation-sensitive resin composition.

The monovalent radiation-degradable onium cation represented by $Y^+$ is exemplified by a radiation-degradable onium cation that contains an element such as S, I, O, N, P, Cl, Br, F, As, Se, Sn, Sb, Te and Bi. A cation that contains S (sulfur) as the element is exemplified by a sulfonium cation, a tetrahydrothiophenium cation, and the like; and a cation that contains I (iodine) as the element is exemplified by an iodonium cation, and the like.

The sulfonium cation is exemplified by a cation represented by the following formula (Q-1), and the like; the tetrahydrothiophenium cation is exemplified by a cation represented by the following formula (Q-2), and the like; and the iodonium cation is exemplified by a cation represented by the following formula (Q-3), and the like.

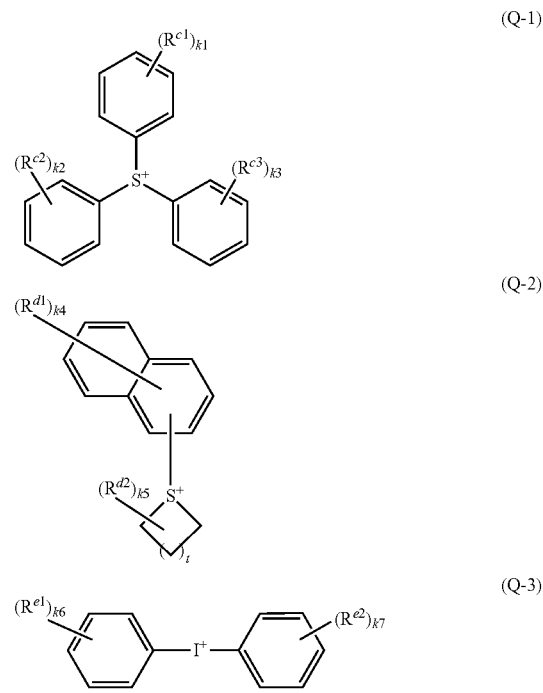

In the above formula (Q-1), $R^{c1}$, $R^{c2}$ and $R^{c3}$ each independently represent a substituted or unsubstituted linear or branched alkyl group having 1 to 12 carbon atoms, a substituted or unsubstituted aromatic hydrocarbon group having 6 to 12 carbon atoms, —$OSO_2$—$R^{P'}$ or —$SO_2$—$R^{Q'}$, or at least two of these groups taken together represent a ring structure by binding with each other; $R^{P'}$ and $R^{Q'}$ each independently represent a substituted or unsubstituted linear or branched alkyl group having 1 to 12 carbon atoms, a substituted or unsubstituted alicyclic hydrocarbon group having 5 to 25 carbon atoms, or a substituted or unsubstituted aromatic hydrocarbon group having 6 to 12 carbon atoms; and k1, k2 and k3 are each independently an integer of 0 to 5, wherein in a case where $R^{c1}$ to $R^{c3}$ as well as $R^{P'}$ and $R^{Q'}$ are each present in a plurality of number, a plurality of $R^{c1}$s are identical to or different from each other, a plurality of $R^{c2}$s are identical to or different from each other, a plurality of $R^{c3}$s are identical to or different from each other, a plurality of $R^{P'}$s are identical to or different from each other, and a plurality of $R^{Q'}$s are identical to or different from each other.

In the above formula (Q-2), $R^{d1}$ represents a substituted or unsubstituted linear or branched alkyl group having 1 to 8 carbon atoms, or a substituted or unsubstituted aromatic hydrocarbon group having 6 to 8 carbon atoms; k4 is an integer of 0 to 7, wherein in a case where $R^{d1}$ is present in a plurality of number, a plurality of $R^{d1}$s are identical to or different from each other, and the plurality of $R^{d1}$s optionally taken together represent a ring structure by binding with each other; $R^{d2}$s represents a substituted or unsubstituted linear or branched alkyl group having 1 to 7 carbon atoms, or a substituted or unsubstituted aromatic hydrocarbon group having 6 or 7 carbon atoms; k5 is an integer of 0 to 6, wherein in a case where $R^{d2}$ is present in a plurality of number, a plurality of $R^{d2}$s are identical to or different from each other, and the plurality of $R^{d2}$s optionally taken together represent a ring structure by binding with each other; and t is an integer of 0 to 3.

In the above formula (Q-3), $R^{e1}$ and $R^{e2}$ each independently represent a substituted or unsubstituted linear or branched alkyl group having 1 to 12 carbon atoms, a substituted or unsubstituted aromatic hydrocarbon group having 6 to 12 carbon atoms, $-OSO_2-R^R$ or $-SO_2-R^S$, or at least two of these groups taken together represent a ring structure by binding with each other; $R^R$ and $R^S$ each independently represent a substituted or unsubstituted linear or branched alkyl group having 1 to 12 carbon atoms, a substituted or unsubstituted alicyclic hydrocarbon group having 5 to 25 carbon atoms, or a substituted or unsubstituted aromatic hydrocarbon group having 6 to 12 carbon atoms; and k6 and k7 are each independently an integer of 0 to 5, wherein in a case where $R^{e1}$, $R^{e2}$, $R^R$ and $R^S$ are each present in a plurality of number, a plurality of $R^{e1}$s are identical to or different from each other, a plurality of $R^{e2}$s are identical to or different from each other, a plurality of $R^R$s are identical to or different from each other, and a plurality of $R^S$s are identical to or different from each other.

Examples of the unsubstituted linear alkyl group which may be represented by $R^{c1}$ to $R^{c3}$, $R^{d1}$, $R^{d2}$, $R^{e1}$ or $R^{e2}$ include a methyl group, an ethyl group, a n-propyl group, a n-butyl group, and the like.

Examples of the unsubstituted branched alkyl group which may be represented by $R^{c1}$ to $R^{c3}$, $R^{d1}$, $R^{d2}$, $R^{e1}$ or $R^{e2}$ include an i-propyl group, an i-butyl group, a sec-butyl group, a t-butyl group, and the like.

Examples of the unsubstituted aromatic hydrocarbon group which may be represented by $R^{c1}$ to $R^{c3}$, $R^{e1}$, or $R^{e2}$ include aryl groups such as a phenyl group, a tolyl group, a xylyl group, a mesityl group and a naphthyl group; aralkyl groups such as a benzyl group and a phenethyl group; and the like.

Examples of the unsubstituted aromatic hydrocarbon group represented by $R^{d1}$ or $R^{d2}$ include a phenyl group, a tolyl group, a benzyl group, and the like.

Examples of the substituent which may substitute a hydrogen atom included in the alkyl group and the aromatic hydrocarbon group include halogen atoms such as a fluorine atom, a chlorine atom, a bromine atom and an iodine atom, a hydroxy group, a carboxy group, a cyano group, a nitro group, an alkoxy group, an alkoxycarbonyl group, an alkoxycarbonyloxy group, an acyl group, an acyloxy group, and the like.

Among these, halogen atoms are preferred, and a fluorine atom is more preferred.

$R^{c1}$ to $R^{c3}$, $R^{d1}$, $R^{d2}$, $R^{e1}$ and $R^{e2}$ preferably represent an unsubstituted linear or branched alkyl group, a fluorinated alkyl group, an unsubstituted monovalent aromatic hydrocarbon group, $-OSO_2-R^{}$, or $-SO_2-R^{}$, more preferably a fluorinated alkyl group, an unsubstituted monovalent aromatic hydrocarbon group, and still more preferably a fluorinated alkyl group, wherein $R^{**}$ represents an unsubstituted monovalent alicyclic hydrocarbon group or an unsubstituted monovalent aromatic hydrocarbon group.

In the above formula (Q-1), k1, k2 and k3 are preferably an integer of 0 to 2, more preferably 0 or 1, and still more preferably 0.

In the above formula (Q-2), k4 is preferably an integer of 0 to 2, more preferably 0 or 1, and still more preferably 1, and k5 is preferably an integer of 0 to 2, more preferably 0 or 1, and still more preferably 0.

In the above formula (Q-3), k6 and k7 are preferably an integer of 0 to 2, more preferably 0 or 1, and still more preferably 0.

Examples of the sulfonium cation include cations represented by the following formulae (i-1) to (i-21), and the like.

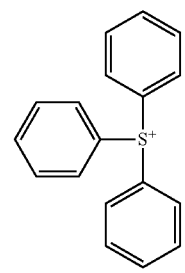

(i-1)

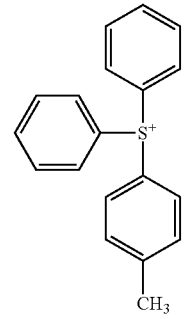

(i-2)

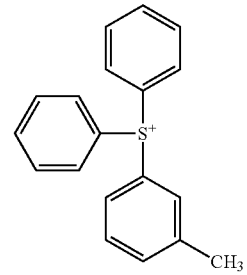

(i-3)

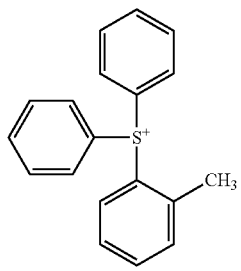
(i-4)
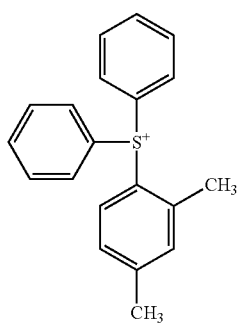
(i-5)
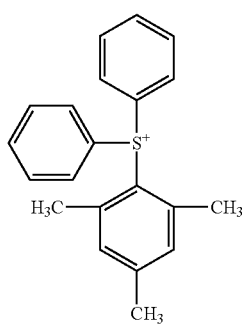
(i-6)
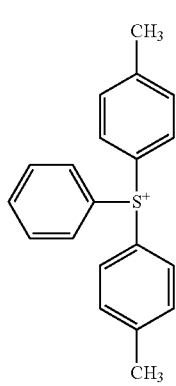
(i-7)
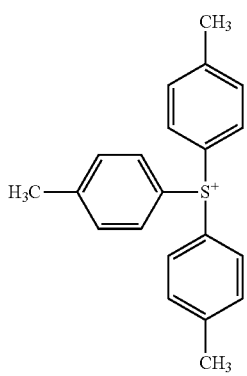
(i-8)
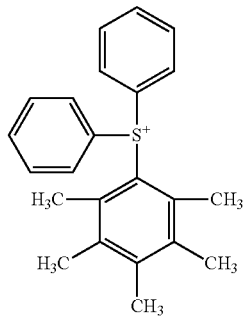
(i-9)
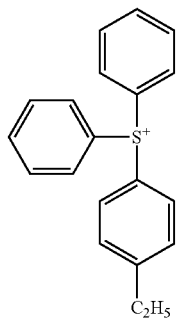
(i-10)
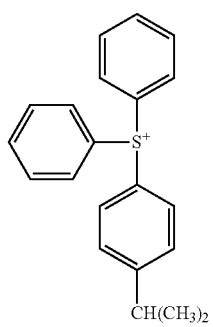
(i-11)

(i-12)
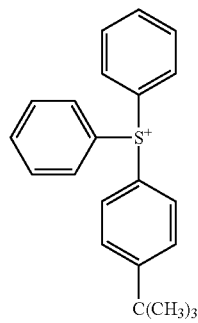
(i-13)
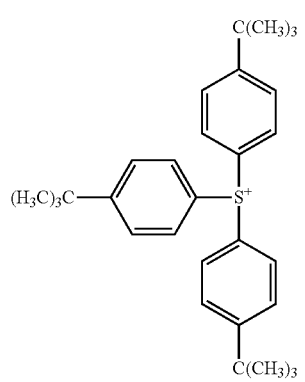
(i-14)
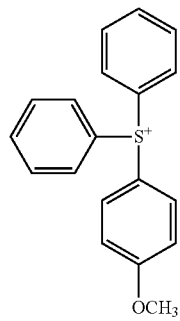
(i-15)
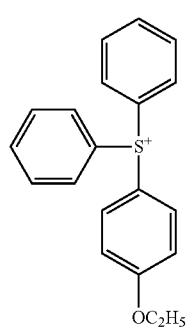
(i-16)
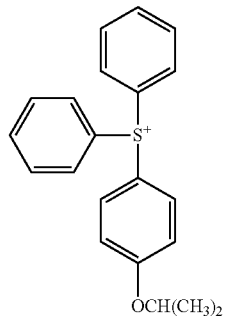
(i-17)
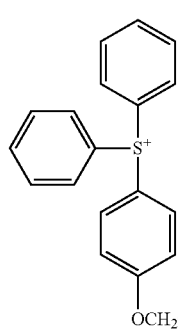
(i-18)
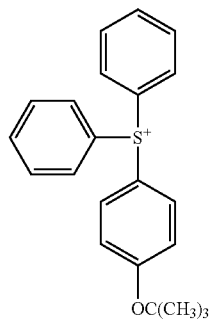
(i-19)
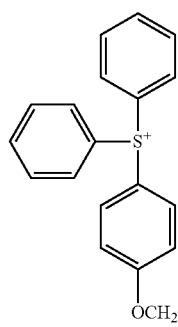

(i-20)

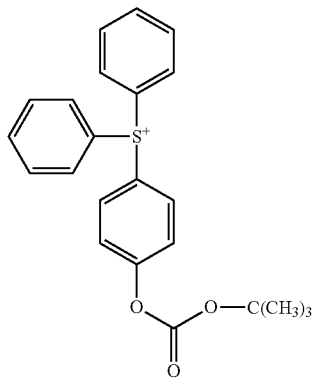

(i-21)

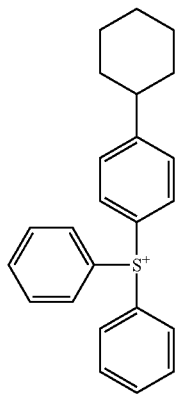

Among these, the cation represented by the above formula (i-1), and the cation represented by the above formula (i-21) are preferred.

Examples of the tetrahydrothiophenium cation include cations represented by the following formulae (i'-1) to (i'-4), and the like.

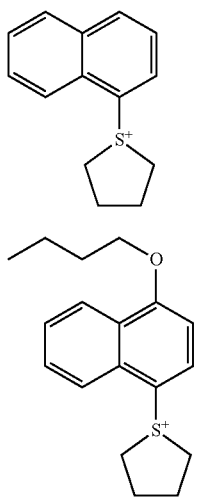

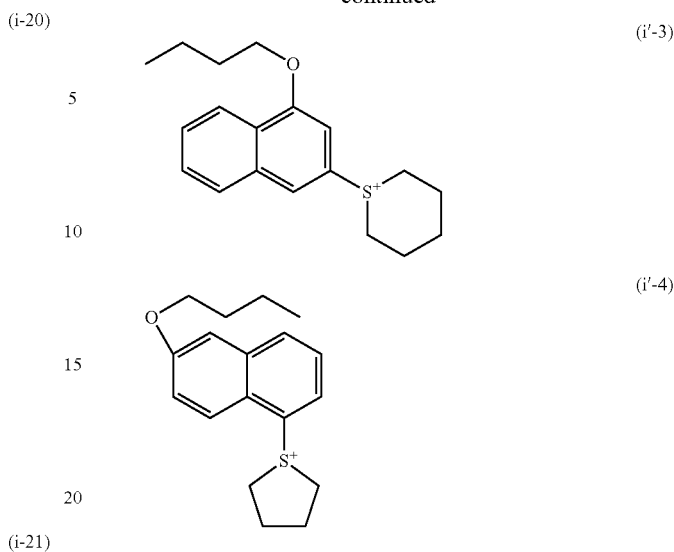

Among these, the cation represented by the above formula (i'-2) is preferred.

Examples of the iodonium cation include cations represented by the following formulae (ii-1) to (ii-25), and the like.

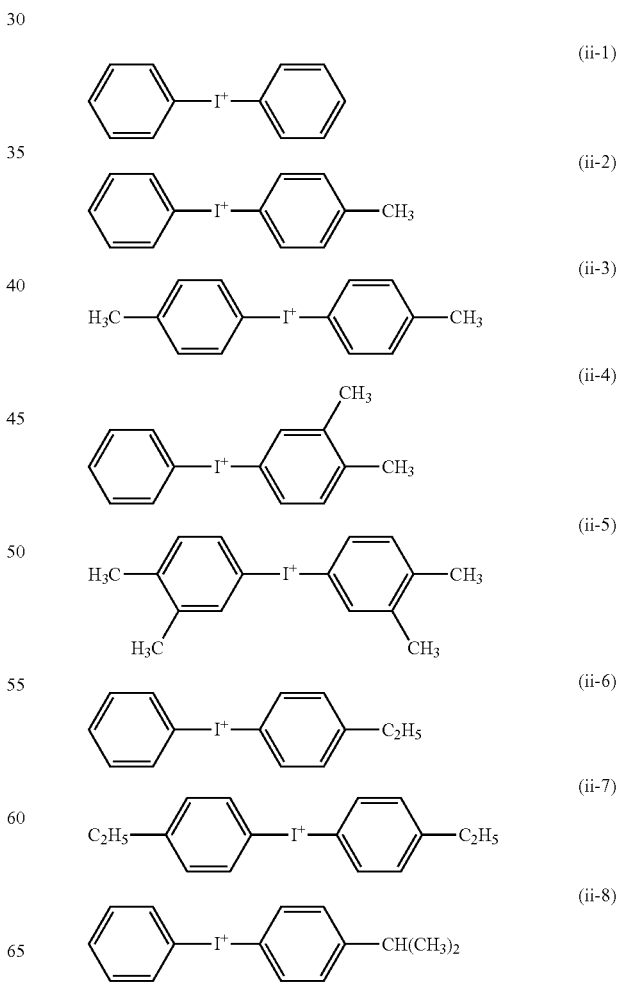

(ii-9) 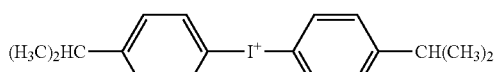

(ii-10) 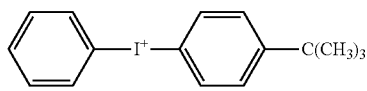

(ii-11) 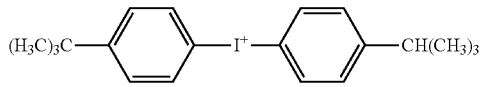

(ii-12) 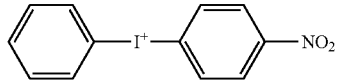

(ii-13) 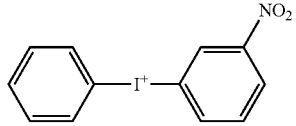

(ii-14) 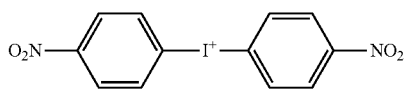

(ii-15) 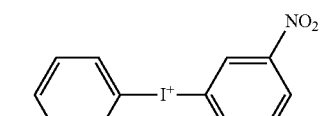

(ii-16) 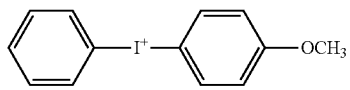

(ii-17) 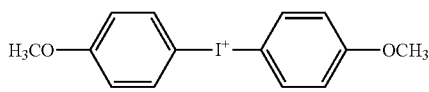

(ii-18) 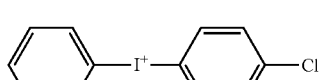

(ii-19) 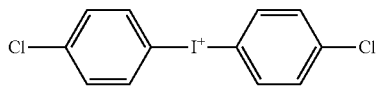

(ii-20) 

(ii-21) 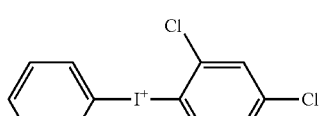

(ii-22) 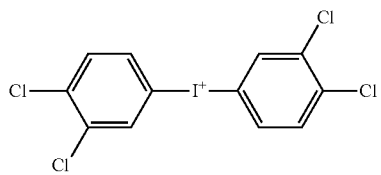

(ii-23) 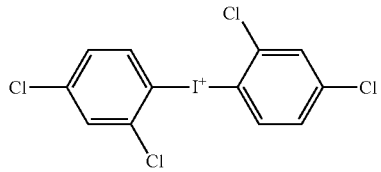

(ii-24) 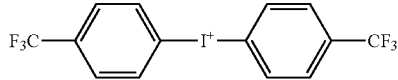

(ii-25) 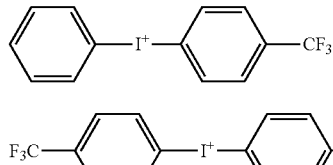

Among these, the cation represented by the above formula (ii-11) is preferred.

The compound (A) is exemplified by a compound represented by the following formula (1a) (hereinafter, may be also referred to as "compound (1a)"), a compound represented by the following formula (1b) (hereinafter, may be also referred to as "compound (1b)"), and the like.

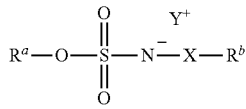  (1a)

In the above formula (1a), X and Y$^+$ are as defined in the above formula (1); and R$^a$ and R$^b$ each independently represent a monovalent organic group having 1 to 20 carbon atoms.

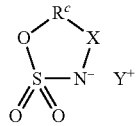  (1b)

In the above formula (1b), X and Y$^+$ are as defined in the above formula (1); and R$^c$ represents a divalent organic group having 1 to 20 carbon atoms.

The monovalent organic group having 1 to 20 carbon atoms represented by R$^a$ and R$^b$ is exemplified by: a monovalent hydrocarbon group having 1 to 20 carbon atoms; a group (q) obtained by incorporating a divalent hetero atom-containing group between the carbon-carbon bond of the hydrocarbon group or into an end on the atomic bonding side of the hydrocarbon group; a group obtained by substituting a part or all of hydrogen atoms included in the hydrocarbon group and the group (q) with a monovalent hetero atom-containing group; and the like.

The monovalent hydrocarbon group having 1 to 20 carbon atoms is exemplified by a linear or branched hydrocarbon group having 1 to 20 carbon atoms, an alicyclic hydrocarbon group having 3 to 20 carbon atoms, an aromatic hydrocarbon group having 6 to 20 carbon atoms, and the like.

Examples of the linear or branched hydrocarbon group include:

alkyl groups such as a methyl group, an ethyl group, a n-propyl group, an i-propyl group, a n-butyl group, an i-butyl group, a sec-butyl group and a t-butyl group;

alkenyl groups such as an ethenyl group, a propenyl group and a butenyl group;

alkynyl groups such as an ethynyl group, a propynyl group and a butynyl group; and the like.

Examples of the alicyclic hydrocarbon group include:

monocyclic cycloalkyl groups such as a cyclopropyl group, a cyclobutyl group, a cyclopentyl group, a cyclohexyl group and a cyclooctyl group;

monocyclic cycloalkenyl groups such as a cyclobutenyl group, a cyclopentenyl group and a cyclohexenyl group;

polycyclic cycloalkyl groups such as a norbornyl group, an adamantyl group, a tricyclodecyl group and a tetracyclododecyl group;

polycyclic cycloalkenyl groups such as a norbornenyl group, a tricyclodecenyl group and a tetracyclododecenyl group; and the like.

Examples of the aromatic hydrocarbon group include:

aryl groups such as a phenyl group, a tolyl group, a xylyl group, a naphthyl group and an anthryl group;

aralkyl groups such as a benzyl group, a phenethyl group, a phenylpropyl group and a naphthylmethyl group; and the like.

The hetero atom which may be included in the monovalent or divalent hetero atom-containing group is exemplified by an oxygen atom, a sulfur atom, a nitrogen atom, a silicon atom, a phosphorus atom, halogen atoms such as a fluorine atom, a chlorine atom and a bromine atom, and the like. Among these, an oxygen atom, a sulfur atom, a nitrogen atom and halogen atoms are preferred, and an oxygen atom and a fluorine atom are more preferred.

Examples of the divalent hetero atom-containing group include —O—, —CO—, —CS—, —NR'—, a combination thereof, and the like, wherein R' represents a hydrogen atom or a monovalent hydrocarbon group having 1 to 10 carbon atoms.

Examples of the monovalent hetero atom-containing group include a hydroxy group, a carboxy group, a sulfanyl group (—SH), an amino group, a cyano group, a halogen atom, and the like.

Among these, $R^a$ and $R^b$ represent preferably a hydrocarbon group, a group that includes a lactone ring, and a group that includes —O—, and more preferably an alkyl group, a cycloalkyl group, an aryl group, a group that includes a polycyclic lactone ring, and a cycloalkyloxyalkyl group, in light of a further improvement of the storage stability and the development defect inhibitory ability of the radiation-sensitive resin composition.

The divalent organic group having 1 to 20 carbon atoms represented by $R^c$ is exemplified by a group obtained by eliminating one hydrogen atom from the monovalent organic group having 1 to 20 carbon atoms exemplified in connection with $R^a$ and $R^b$, and the like.

Among these, $R^c$ represents preferably a hydrocarbon group, more preferably a linear or branched hydrocarbon group, still more preferably an alkenediyl group, and particularly preferably 1,2-propenediyl group, in light of a further improvement of the storage stability and the development defect inhibitory ability of the radiation-sensitive resin composition.

Examples of the compound (A) represented by the above formula (1a) include compounds represented by the following formulae (1a1) to (1a6) (hereinafter, may be also referred to as "compounds (1a1) to (1a6)").

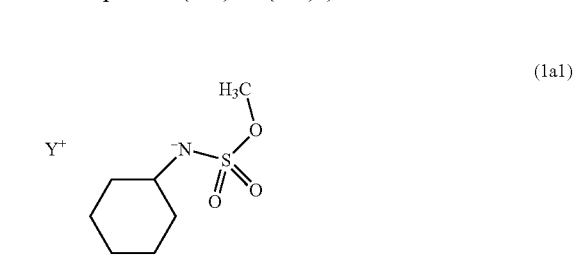

(1a1)

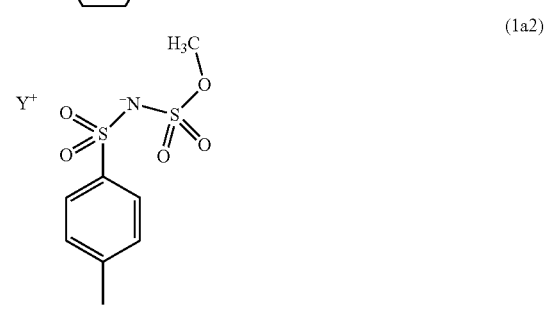

(1a2)

(1a3)

(1a4)

(1a5)

(1a6)

In the above formulae (1a1) to (1a6), $Y^+$ is as defined in the above formula (1).

Examples of the compound (A) represented by the above formula (1b) include compounds represented by the following formulae (1b1) to (1b6) (hereinafter, may be also referred to as "compounds (1b1) to (1b6)").

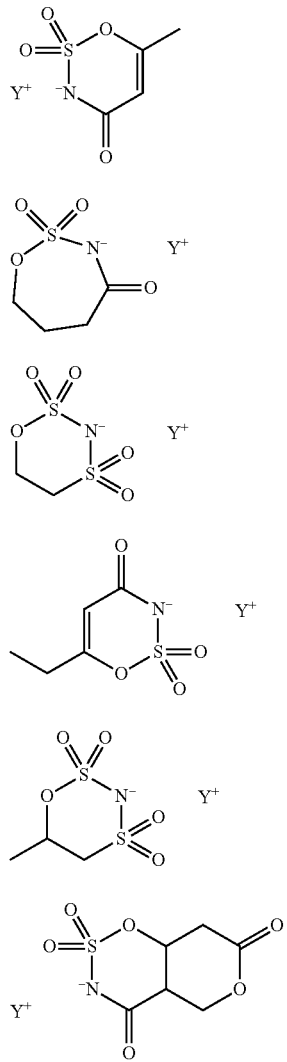

(1b1)

(1b2)

(1b3)

(1b4)

(1b5)

(1b6)

In the above formulae (1b1) to (1b6), $Y^+$ is as defined in the above formula (1).

Among these, the compound (A) is preferably the compound (1b), more preferably the compound (1b1) and the compound (1b4), and still more preferably the compound (1b1).

For example, in a case where the compound (A) is the compound (1a), the compound (A) can be synthesized in accordance with the following reaction scheme.

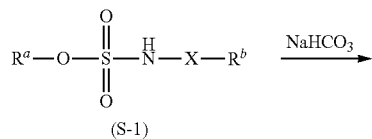

(S-1)

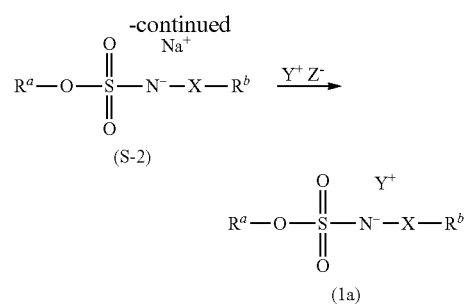

(S-2)

(1a)

In the above scheme, X represents a carbonyl group, a sulfonyl group or a single bond; $R^a$ and $R^b$ each independently represent a monovalent organic group having 1 to 20 carbon atoms; $Y^+$ represents a monovalent radiation-degradable onium cation; and $Z^-$ represents a monovalent halide ion.

The salt compound represented by the above formula (S-2) can be obtained by reacting the compound represented by the above formula (S-1) with a base such as, for example, sodium bicarbonate in an aqueous solution and the like. Next, the compound (1a) can be produced by reacting the compound (S-2) thus obtained with a halide of a radiation-degradable onium cation $Y^+$ (for example, $Y^+$ $Br^-$, and the like) in an aqueous solution and the like. The resulting compound (1a) can be purified by washing with a solvent, recrystallization, and the like.

Even in a case where the compound (A) is other than the compound (1a), the compound (A) can be synthesized in a similar manner to the process shown above.

The lower limit of the content of the compound (A) with respect to the total solid content of the radiation-sensitive resin composition is preferably 0.1% by mass, more preferably 0.5% by mass, still more preferably 1% by mass, and particularly preferably 3% by mass. The upper limit of the content with respect to the total solid content is preferably 30% by mass, more preferably 20% by mass, still more preferably 15% by mass, and particularly preferably 10% by mass. When the content of the compound (A) is less than the lower limit, the lithography performances such as the resolving ability of the radiation-sensitive resin composition may be deteriorated. When the content of the compound (A) is greater than the upper limit, the sensitivity of the radiation-sensitive resin composition may be deteriorated.

The lower limit of the content of the compound (A) with respect to 100 parts by mass of the polymer (E) described later is preferably 0.1 parts by mass, more preferably 0.5 parts by mass, still more preferably 1 part by mass, and particularly preferably 3 parts by mass. The upper limit of the content of the compound (A) with respect to 100 parts by mass of the polymer (E) is preferably 30 parts by mass, more preferably 20 parts by mass, still more preferably 15 parts by mass, and particularly preferably 10 parts by mass.

(B) Fluorine Atom-Containing Polymer

The fluorine atom-containing polymer (B) includes a fluorine atom. According to the radiation-sensitive resin composition, since the fluorine atom-containing polymer (B) is contained, in forming the resist film, the uneven distribution of the fluorine atom-containing polymer in the film tends to be promoted in the surface layer of a resist film owing to an oil repellent characteristic of the fluorine atom-containing polymer in the film, leading to the possibility of the inhibition of the elution of an acid generator, an acid diffusion controller and the like into a liquid immersion medium in the exposure through the liquid immersion medium. In addition, a water repellent characteristic of the fluorine atom-containing polymer (B) allows an advancing contact angle of the liquid immersion medium on the resist film to be controlled within a desired range, leading to the inhibition of the generation of bubble defects. Furthermore, a great receding contact angle of the liquid immersion medium on the resist film can be attained, leading to avoidance of residual water droplets and allowing a scanning exposure at high speed to be achieved. Due to thus containing the fluorine atom-containing polymer (B), the radiation-sensitive resin composition can provide a resist film suitable for the liquid immersion lithography process.

Although the fluorine atom-containing polymer (B) is not particularly limited as long as it includes a fluorine atom, it is preferred that the fluorine atom-containing polymer (B) has a content of fluorine atoms (% by mass) greater than that of the polymer (E) described later. When the fluorine atom-containing polymer (B) has a content of fluorine atoms greater than that of the polymer (E), a degree of the aforementioned uneven distribution is further increased, leading to an improvement of the characteristics such as the water repellency and the elution inhibitory ability of the resulting resist film.

The content of fluorine atoms of the fluorine atom-containing polymer (B) is preferably no less than 1% by mass, more preferably 2% by mass to 60% by mass, still more preferably 4% by mass to 40% by mass, and particularly preferably 7% by mass to 30% by mass. When the content of fluorine atoms is less than the lower limit, the hydrophobicity of the surface of the resist film may be deteriorated. It is to be noted that the content of fluorine atoms (% by mass) of the polymer can be calculated based on the structure of the polymer determined by $^{13}$C-NMR spectroscopy.

The mode of incorporation of the fluorine atom in the fluorine atom-containing polymer (B) is not particularly limited, and the fluorine atom may bond to any of a main chain, a side chain or an end; however, it is preferred that a structural unit that includes a fluorine atom (hereinafter, may be also referred to as "structural unit (I)") is included. The fluorine atom-containing polymer (B) preferably has a structural unit that includes an acid-labile group (a structural unit (II) in the polymer (E) described later) in addition to the structural unit (I) in light of an improvement of the development defect inhibitory ability of the radiation-sensitive resin composition.

The fluorine atom-containing polymer (B) preferably includes an alkali-labile group. When the fluorine atom-containing polymer (B) includes the alkali-labile group, the nature of the surface of a resist film can be effectively altered from being hydrophobic to being hydrophilic in the development with an alkali, leading to an improvement of the development defect inhibitory ability of the radiation-sensitive resin composition. When the fluorine atom-containing polymer (B) includes the alkali-labile group, an ion exchange between the alkali-labile group and an onium salt compound conventionally used, etc., is likely to occur easily, leading to further deterioration of the storage stability and the development defect inhibitory ability of the radiation-sensitive resin composition. However, in the radiation-sensitive resin composition, the specific compound (A) is used as an onium salt compound, and therefore superior storage stability and development defect inhibitory ability can be attained even in the case where the fluorine atom-containing polymer (B) includes the alkali-labile group. "Alkali-labile group" as referred to means a group that substitutes a hydrogen atom included in a carboxy group, a hydroxy group and the like and is dissociated in an alkaline aqueous solution (for example, a 2.38% by mass aqueous tetramethylammonium hydroxide solution at 23° C.).

The structural unit (I) is preferably at least one selected from the group consisting of a structural unit represented by the following formula (2a) (hereinafter, may be also referred to as "structural unit (Ia)") and a structural unit represented by the following formula (2b) (hereinafter, may be also referred to as "structural unit (Ib)"). The structural unit (I) may include one, or two or more types of each of the structural unit (Ia) and the structural unit (Ib).

Structural Unit (Ia)

The structural unit (Ia) is represented by the following formula (2a). Due to the fluorine atom-containing polymer (B) having the structural unit (Ia), the content of fluorine atoms can be adjusted.

(2a)

In the above formula (2a), $R^d$ represents a hydrogen atom, a methyl group or a trifluoromethyl group; G represents a single bond, an oxygen atom, a sulfur atom, —CO—O—, —SO$_2$—O—NH—, —CO—NH— or —O—CO—NH—; and $R^e$ represents a monovalent fluorinated linear or branched hydrocarbon group having 1 to 6 carbon atoms or a monovalent fluorinated alicyclic hydrocarbon group having 4 to 20 carbon atoms.

$R^d$ represents preferably a hydrogen atom or a methyl group, and more preferably a methyl group in light of the copolymerizability of a monomer that gives the structural unit (Ia), and the like.

G represents preferably —CO—O—, —SO$_2$—O—NH—, —CO—NH— or —O—CO—NH—, and more preferably —CO—O—.

Examples of the monovalent fluorinated linear or branched hydrocarbon group having 1 to 6 carbon atoms which may be represented by $R^e$ include a trifluoromethyl group, a 2,2,2-trifluoroethyl group, a perfluoroethyl group, a 2,2,3,3,3-pentafluoropropyl group, a 1,1,1,3,3,3-hexafluoropropyl group, a perfluoro-n-propyl group, a perfluoro-i-propyl group, a perfluoro-n-butyl group, a perfluoro-i-butyl group, a perfluoro-t-butyl group, a 2,2,3,3,4,4,5,5-octafluoropentyl group, a perfluorohexyl group, and the like.

Examples of the monovalent fluorinated alicyclic hydrocarbon group having 4 to 20 carbon atoms which may be represented by $R^e$ include a monofluorocyclopentyl group, a difluorocyclopentyl group, a perfluorocyclopentyl group, a monofluorocyclohexyl group, a difluorocyclopentyl group, a perfluorocyclohexylmethyl group, a fluoronorbornyl group, a fluoroadamantyl group, a fluorobornyl group, a fluoroisobornyl group, a fluorotricyclodecyl group, a fluorotetracyclodecyl group, and the like.

Among these, $R^e$ represents preferably a fluorinated linear or branched hydrocarbon group, more preferably a 2,2,2-trifluoroethyl group and a 1,1,1,3,3,3-hexafluoro-2-propyl group, and still more preferably a 1,1,1,3,3,3-hexafluoro-2-propyl group.

The proportion of the structural unit (Ia) with respect to the total structural units constituting the fluorine atom-containing polymer (B) is preferably 0 mol % to 90 mol %, more preferably 3 mol % to 70 mol %, and still more preferably 5 mol % to 50 mol %. When the proportion falls within the above range, the content of fluorine atoms of the fluorine atom-containing polymer (B) can be adjusted more adequately.

Structural Unit (Ib)

The structural unit (Ib) is represented by the following formula (2b). Due to the fluorine atom-containing polymer (B) having the structural unit (Ib), the content of fluorine atoms can be adjusted, and the water repellency and the hydrophilicity can be altered after the development with an alkali as compared with those before the development with an alkali.

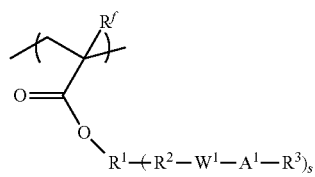

(2b)

In the above formula (2b), $R^f$ represents a hydrogen atom, a methyl group or a trifluoromethyl group; $R^1$ represents a hydrocarbon group having 1 to 20 carbon atoms and having a valency of (s+1), or the hydrocarbon group to which an oxygen atom, a sulfur atom, —NR'—, a carbonyl group, —CO—O— or —CO—NH-bonds at an end thereof on a side linking to $R^2$, wherein R' represents a hydrogen atom or a monovalent hydrocarbon group having 1 to 10 carbon atoms; $R^2$ represents a single bond or a divalent organic group having 1 to 20 carbon atoms; $W^1$ represents a single bond or a divalent fluorinated linear or branched hydrocarbon group having 1 to 20 carbon atoms; $A^1$ represents an oxygen atom, —NR"—, —CO—O—* or —SO$_2$—O—*, wherein R" represents a hydrogen atom or a monovalent hydrocarbon group having 1 to 10 carbon atoms, and wherein * denotes a biding site to $R^3$; $R^3$ represents a hydrogen atom or a monovalent organic group having 1 to 30 carbon atoms; and s is an integer of 1 to 3, wherein in a case where s is 1, $R^1$ optionally represents a single bond, wherein in a case where s is 2 or 3, a plurality of $R^2$s are identical to or different from each other, a plurality of $W^1$s are identical to or different from each other, a plurality of $A^1$s are identical to or different from each other, and a plurality of $R^3$s are identical to or different from each other, and wherein in a case where $W^1$ represents a single bond, $R^3$ represents a group that includes a fluorine atom.

$R^f$ represents preferably a hydrogen atom or a methyl group, and more preferably a methyl group in light of the copolymerizability of a monomer that gives the structural unit (Ib), and the like.

The hydrocarbon group having 1 to 20 carbon atoms and having a valency of (s+1) which may be represented by R' is exemplified by a group obtained by eliminating s hydrogen atoms from the monovalent hydrocarbon group exemplified in connection with $R^a$ and $R^b$ in the above formula (1), and the like.

Preferably, s is 1 or 2, and more preferably 1.

In a case where s is 1, $R^1$ represents preferably a single bond or a divalent hydrocarbon group, more preferably a single bond or an alkanediyl group, still more preferably a single bond or an alkanediyl group having 1 to 4 carbon atoms, and particularly preferably a single bond, a methanediyl group or a propanediyl group.

The divalent organic group having 1 to 20 carbon atoms which may be represented by $R^2$ is exemplified by groups similar to the divalent organic group exemplified in connection with $R^c$ in the above formula (1b), and the like.

$R^2$ preferably represents a single bond.

Examples of the divalent fluorinated linear or branched hydrocarbon group having 1 to 20 carbon atoms which may be represented by $W^1$ include:

fluorinated alkanediyl groups such as a fluoromethanediyl group, a difluoromethanediyl group, a fluoroethanediyl group, a difluoroethanediyl group, a tetrafluoroethanediyl group, a hexafluoropropanediyl group and an octafluorobutanediyl group;

fluorinated alkenediyl groups such as a fluoroethenediyl group and a difluoroethenediyl group; and the like.

Among these, a fluorinated alkanediyl group is preferred, and a difluoromethanediyl group is more preferred.

$A^1$ represents preferably an oxygen atom, —CO—O—* or —SO$_2$—O—*, and more preferably —CO—O—*.

The monovalent organic group having 1 to 30 carbon atoms which may be represented by $R^3$ is exemplified by an alkali-labile group, an acid-labile group, a hydrocarbon group having 1 to 30 carbon atoms, and the like. Among these, $R^3$ preferably represents an alkali-labile group. When $R^3$ represents an alkali-labile group, the nature of the surface of a resist film can be altered more effectively from being hydrophobic to being hydrophilic in the development with an alkali, leading to a further improvement of the development defect inhibitory ability of the radiation-sensitive resin composition.

In a case where $R^3$ represents an alkali-labile group, $R^3$ preferably represents groups represented by the following formulae (iii) to (v) (hereinafter, may be also referred to as "groups (iii) to (v)").

(iii)

In the above formula (iii), $R^{3a}$ and $R^{3b}$ each independently represent a monovalent organic group having 1 to 20 carbon atoms, or $R^{3a}$ and $R^{3b}$ taken together represent an alicyclic structure having 3 to 20 ring atoms by binding with each other, together with the carbon atom to which $R^{3a}$ and $R^{3b}$ bond.

(iv)

In the above formula (iv), $R^{3c}$ and $R^{3d}$ each independently represent a monovalent organic group having 1 to 20 carbon atoms, or $R^{3c}$ and $R^{3d}$ taken together represent a heterocyclic structure having 3 to 20 ring atoms by binding with each other, together with the nitrogen atom to which $R^{3c}$ and $R^{3d}$ bond.

(v)

In the above formula (v), $R^{3e}$ represents a monovalent hydrocarbon group having 1 to 20 carbon atoms or a monovalent fluorinated hydrocarbon group having 1 to 20 carbon atoms.

The monovalent organic group having 1 to 20 carbon atoms and the monovalent hydrocarbon group having 1 to 20 carbon atoms are exemplified by groups similar to those exemplified in connection with $R^a$ and $R^b$ in the above formula (1), and the like.

The monovalent fluorinated hydrocarbon group having 1 to 20 carbon atoms is exemplified by a group obtained by substituting with a fluorine atom a part or all of hydrogen atoms included in the group exemplified in connection with the monovalent hydrocarbon group having 1 to 20 carbon atoms, and the like.

Groups represented by the following formulae (iii-1) to (iii-4) are preferred as the group (iii), a group represented by the following formula (iv-1) is preferred as the group (iv), and groups represented by the following formulae (v-1) to (v-5) are preferred as the group (v).

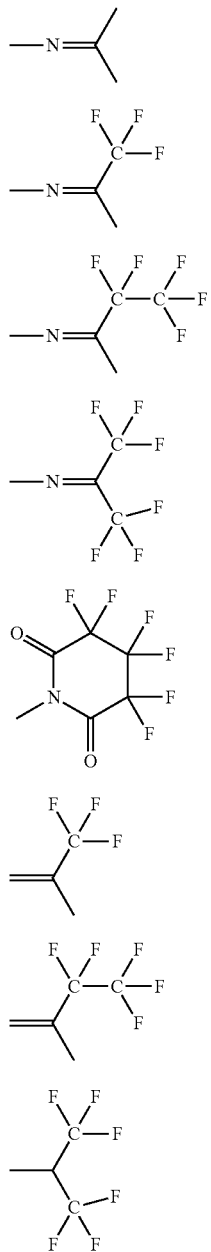

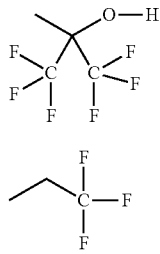

Among these, the group represented by the above formula (v-3) and the group represented by the above formula (v-5) are preferred.

Moreover, $R^3$ preferably represents a hydrogen atom in light of an improvement of the solubility of the fluorine atom-containing polymer (B) in an alkaline developer solution. In this case, when $A^1$ represents an oxygen atom and $W^1$ represents 1,1,1,3,3,3-hexafluoro-2,2-methanediyl group, the solubility may be further improved.

The proportion of the structural unit (Ib) with respect to the total structural units constituting the fluorine atom-containing polymer (B) is preferably 10 mol % to 90 mol %, more preferably 20 mol % to 85 mol %, and still more preferably 40 mol % to 80 mol %. When the proportion falls within the above range, the water repellency and the hydrophilicity, etc. of the surface of a resist film provided using the radiation-sensitive resin composition can be more appropriately adjusted before and after the development with an alkali.

The proportion of the structural unit (I) with respect to the total structural units constituting the fluorine atom-containing polymer (B) is preferably 20 mol % to 90 mol %, more preferably 30 mol % to 85 mol %, and still more preferably 40 mol % to 80 mol %.

The proportion of the structural unit that includes an acid-labile group (the structural unit (II) in the polymer (E) described later) in the fluorine atom-containing polymer (B) with respect to the total structural units constituting the fluorine atom-containing polymer (B) is preferably 10 mol % to 60 mol %, more preferably 15 mol % to 50 mol %, and still more preferably 20 mol % to 40 mol %. When the proportion of the structural unit that includes an acid-labile group in the fluorine atom-containing polymer (B) falls within the above range, the development defect inhibitory ability of the radiation-sensitive resin composition may be further improved.

The lower limit of the content of the fluorine atom-containing polymer (B) with respect to 100 parts by mass of the compound (A) is preferably 5 parts by mass, more preferably 10 parts by mass, still more preferably 20 parts by mass, and particularly preferably 25 parts by mass. The upper limit of the content of the fluorine atom-containing polymer (B) with respect to 100 parts by mass of the compound (A) is preferably 2,000 parts by mass, more preferably 500 parts by mass, still more preferably 100 parts by mass, and particularly preferably 70 parts by mass. When the content of the fluorine atom-containing polymer (B) falls within the above range, the storage stability and the development defect inhibitory ability of the radiation-sensitive resin composition may be improved.

The lower limit of the content of the fluorine atom-containing polymer (B) with respect to 100 parts by mass of the polymer (E) described later is preferably 0.1 parts by mass, more preferably 0.2 parts by mass, still more preferably 0.5 parts by mass, and particularly preferably 1 part by mass. The upper limit of the content of the fluorine atom-containing polymer (B) with respect to 100 parts by mass of the polymer (E) is preferably 30 parts by mass, more preferably 20 parts by mass, still more preferably 15 parts by mass, and particularly preferably 10 parts by mass.

Synthesis Method of Fluorine Atom-Containing Polymer (B)

The fluorine atom-containing polymer (B) can be synthesized, for example, by polymerizing monomer(s) that give(s) each structural unit in an appropriate solvent using a radical polymerization initiator, and the like.

The radical polymerization initiator is exemplified by: azo radical initiators such as azobisisobutyronitrile (AIBN), 2,2'-azobis(4-methoxy-2,4-dimethylvaleronitrile), 2,2'-azobis(2-cyclopropylpropionitrile), 2,2'-azobis(2,4-dimethylvaleronitrile) and dimethyl 2,2'-azobisisobutyrate; peroxide radical initiators such as benzoyl peroxide, t-butyl hydroperoxide and cumene hydroperoxide; and the like. Among these, AIBN and dimethyl 2,2'-azobisisobutyrate are preferred, and AIBN is more preferred. These radical initiators may be used either alone, or as a mixture of two or more types thereof.

Examples of the solvent used in the polymerization include:
alkanes such as n-pentane, n-hexane, n-heptane, n-octane, n-nonane and n-decane;
cycloalkanes such as cyclohexane, cycloheptane, cyclooctane, decalin and norbornane;
aromatic hydrocarbons such as benzene, toluene, xylene, ethylbenzene and cumene;
halogenated hydrocarbons such as chlorobutanes, bromohexanes, dichloroethanes, hexamethylene dibromide and chlorobenzene;
saturated carboxylic acid esters such as ethyl acetate, n-butyl acetate, i-butyl acetate and methyl propionate;
ketones such as acetone, methyl ethyl ketone, 4-methyl-2-pentanone and 2-heptanone;
ethers such as tetrahydrofuran, dimethoxyethanes and diethoxyethanes;
alcohols such as methanol, ethanol, 1-propanol, 2-propanol and 4-methyl-2-pentanol; and the like. These solvents used in the polymerization may be used either alone, or in combination of two or more types thereof.

The reaction temperature in the polymerization is typically 40° C. to 150° C., and preferably 50° C. to 120° C. The reaction time period is typically 1 hour to 48 hrs, and preferably 1 hour to 24 hrs.

Although the polystyrene equivalent weight average molecular weight (Mw) of the fluorine atom-containing polymer (B) as determined by gel permeation chromatography (GPC) is not particularly limited, the Mw is preferably no less than 1,000 and no greater than 50,000, more preferably no less than 2,000 and no greater than 30,000, still more preferably no less than 2,500 and no greater than 20,000, and particularly preferably no less than 3,000 and no greater than 15,000. When the Mw of the fluorine atom-containing polymer (B) falls within the above range, the coating property and the development defect inhibitory ability of the radiation-sensitive resin composition may be improved. When the Mw of the fluorine atom-containing polymer (B) is less than the lower limit, a resist film exhibiting sufficient heat resistance may not be obtained. When the Mw of the fluorine atom-containing polymer (B) is greater than the upper limit, the developability of the resist film may be deteriorated.

The ratio (Mw/Mn) of Mw to the polystyrene equivalent number average molecular weight (Mn) as determined by GPC of the fluorine atom-containing polymer (B) is typically no less than 1 and no greater than 5, preferably no less than 1 and no greater than 3, and still more preferably no less than 1 and no greater than 2.

The Mw and Mn of the polymer as used herein are determined using gel permeation chromatography (GPC) under the following conditions:
GPC columns: "G2000HXL" ×2, "G3000HXL" ×1, and "G4000HXL" ×1, each supplied by Tosoh Corporation;
column temperature: 40° C.;
elution solvent: tetrahydrofuran;
flow rate: 1.0 mL/min;
sample concentration: 1.0% by mass;
amount of injected sample: 100 µL;
detector: differential refractometer; and
standard substance: mono-dispersed polystyrene.

(C) Solvent

The radiation-sensitive resin composition typically contains the solvent (C). The solvent (C) is not particularly limited as long as it is capable of at least dissolving or dispersing the compound (A) and the fluorine atom-containing polymer (B), as well as the acid generator (D) which may be contained as needed, and the like.

The solvent (C) is exemplified by an alcohol solvent, an ether solvent, a ketone solvent, an amide solvent, an ester solvent, a hydrocarbon solvent, and the like.

Examples of the alcohol solvent include:
aliphatic monohydric alcohol solvents having 1 to 18 carbon atoms such as 4-methyl-2-pentanol and n-hexanol;
alicyclic monohydric alcohol solvents having 3 to 18 carbon atoms such as cyclohexanol;
polyhydric alcohol solvents having 2 to 18 carbon atoms such as 1,2-propylene glycol;
polyhydric alcohol partial ether solvents having 3 to 19 carbon atoms such as propylene glycol monomethyl ether; and the like.

Examples of the ether solvent include:
dialkyl ether solvents such as diethyl ether, dipropyl ether, dibutyl ether, dipentyl ether, diisoamyl ether, dihexyl ether and diheptyl ether;
cyclic ether solvents such as tetrahydrofuran and tetrahydropyran;
aromatic ring-containing ether solvents such as diphenyl ether and anisole (methyl phenyl ether); and the like.

Examples of the ketone solvent include:
linear ketone solvents such as acetone, methyl ethyl ketone, methyl n-propyl ketone, methyl n-butyl ketone, diethyl ketone, methyl iso-butyl ketone, 2-heptanone (methyl n-pentyl ketone), ethyl n-butyl ketone, methyl n-hexyl ketone, di-iso-butyl ketone and trimethylnonanone:
cyclic ketone solvents such as cyclopentanone, cyclohexanone, cycloheptanone, cyclooctanone and methylcyclohexanone:
2,4-pentanedione, acetonylacetone and acetophenone; and the like.

Examples of the amide solvent include:
cyclic amide solvents such as N,N'-dimethylimidazolidinone and N-methylpyrrolidone;
linear amide solvents such as N-methylformamide, N,N-dimethylformamide, N,N-diethylformamide, acetamide, N-methylacetamide, N,N-dimethylacetamide and N-methylpropionamide; and the like.

Examples of the ester solvent include:
monocarboxylic acid ester solvents such as n-butyl acetate and ethyl lactate;

polyhydric alcohol carboxylate solvents such as propylene glycol acetate;

polyhydric alcohol partial ether carboxylate solvents such as propylene glycol monomethyl ether acetate;

lactone solvents such as γ-butyrolactone and 5-valerolactone; polyvalent carboxylic acid diester solvents such as diethyl oxalate;

carbonate solvents such as dimethyl carbonate, diethyl carbonate, ethylene carbonate and propylene carbonate; and the like.

Examples of the hydrocarbon solvent include:

aliphatic hydrocarbon solvents having 5 to 12 carbon atoms such as n-pentane and n-hexane;

aromatic hydrocarbon solvents having 6 to 16 carbon atoms such as toluene and xylene; and the like.

Among these, as the solvent (C), ester solvents and ketone solvents are preferred, polyhydric alcohol partial ether carboxylate solvents, lactone solvents and cyclic ketone solvents are more preferred, polyhydric alcohol partial alkyl ether acetates, lactone solvents and cycloalkanones are still more preferred, and propylene glycol monomethyl ether acetate, γ-butyrolactone and cyclohexanone are particularly preferred. The radiation-sensitive resin composition may contain one, or two or more types of the solvent (C).

(D) Acid Generator

The acid generator (D) is a substance that generates an acid upon an exposure. The acid-labile group included in the fluorine atom-containing polymer (B), the polymer (E), and the like is dissociated by the generated acid to generate a carboxy group and the like, whereby the solubility of these polymers in a developer solution is altered, leading to the formation of a resist pattern using the radiation-sensitive resin composition. The mode of incorporation of the acid generator (D) in the radiation-sensitive resin composition may be in a low molecular weight compound form (hereinafter, may be also referred to as "(D) acid generating agent" or "acid generating agent (D)", as appropriate), as described later, or in an incorporated form as a part of the polymer, or in both of these forms.

The acid generating agent (D) is exemplified by an onium salt compound, an N-sulfonyloxyimide compound, a halogen-containing compound, a diazo ketone compound, and the like.

The onium salt compound is exemplified by a sulfonium salt, a tetrahydrothiophenium salt, an iodonium salt, a phosphonium salt, a diazonium salt, a pyridinium salt, and the like.

Specific examples of the acid generating agent (D) include compounds disclosed in paragraphs [0080] to [0113] of Japanese Unexamined Patent Application, Publication No. 2009-134088, and the like.

A compound represented by the following formula (vi) is preferred as the acid generator (D). When the compound represented by the following formula (vi) is employed as the acid generating agent (D), a diffusion length of the acid generated upon the exposure in the resist film is presumed to be reduced more adequately due to an interaction, etc. with a polar structure included in the fluorine atom-containing polymer (B) or the polymer (E), resulting in a further improvement of the lithography performances of the radiation-sensitive resin composition.

$$R^{b1}\text{—}R^{b2}\text{—}SO_3^-M^+ \quad\quad (vi)$$

In the above formula (vi), $R^{b1}$ represents a monovalent group that has an alicyclic structure having 6 or more ring atoms, or a monovalent group that has an aliphatic heterocyclic structure having 6 or more ring atoms; $R^{b2}$ represents a fluorinated alkanediyl group having 1 to 10 carbon atoms; and $M^+$ represents a monovalent radiation-degradable onium cation.

"Ring atoms" in $R^{b1}$ means atoms that constitute the ring of the alicyclic structure and the aliphatic heterocyclic structure, and in the case of polycyclic alicyclic structures and polycyclic aliphatic heterocyclic structures, means atoms that constitute the polycyclic structures.

Examples of the monovalent group, which may be represented by $R^{b1}$, that has an alicyclic structure having 6 or more ring atoms include:

monocyclic cycloalkyl groups such as a cyclooctyl group, a cyclononyl group, a cyclodecyl group and a cyclododecyl group;

monocyclic cycloalkenyl groups such as a cyclooctenyl group and a cyclodecenyl group;

polycyclic cycloalkyl groups such as a norbornyl group, an adamantyl group, a tricyclodecyl group and a tetracyclododecyl group;

polycyclic cycloalkenyl groups such as a norbornenyl group and a tricyclodecenyl group; and the like.

Examples of the monovalent group, which may be represented by $R^{b1}$, that has an aliphatic heterocyclic structure having 6 or more ring atoms include:

groups having a lactone structure such as a norbornanelacton-yl group;

groups having a sultone structure such as a norbornanesulton-yl group;

oxygen atom-containing heterocyclic groups such as an oxacycloheptyl group and an oxanorbornyl group;

nitrogen atom-containing heterocyclic groups such as an azacyclohexyl group, an azacycloheptyl group and a diazabicyclooctan-yl group;

sulfur atom-containing heterocyclic groups such as a thiacycloheptyl group and a thianorbornyl group; and the like.

The number of the ring atoms in the group represented by $R^{b1}$ is preferably no less than 8, more preferably 9 to 15, and still more preferably 10 to 13 in light of further optimization of the diffusion length of the aforementioned acid.

Among these, $R^{b1}$ represents preferably a monovalent group that has an alicyclic structure having 9 or more ring atoms, and a monovalent group that has an aliphatic heterocyclic structure having 9 or more ring atoms, more preferably an adamantyl group, a hydroxyadamantyl group, a norbornanelacton-yl group, and a 5-oxo-4-oxatricyclo[4.3.1.1$^{3,8}$]undecan-yl group, and still more preferably an adamantyl group.

Examples of the fluorinated alkanediyl group having 1 to 10 carbon atoms represented by $R^{b2}$ include groups obtained by substituting at least one hydrogen atom(s) included in an alkanediyl group having 1 to 10 carbon atoms such as a methanediyl group, an ethanediyl group and a propanediyl group with a fluorine atom, and the like.

Among these, a fluorinated alkanediyl group in which a fluorine atom bonds to a carbon atom adjacent to a $SO_3^-$ group is preferred, a fluorinated alkanediyl group in which two fluorine atoms bond to a carbon atom adjacent to a $SO_3^-$ group is more preferred, and a 1,1-difluoromethanediyl group, a 1,1-difluoroethanediyl group, a 1,1,3,3,3-pentafluoro-1,2-propanediyl group, a 1,1,2,2-tetrafluoroethanediyl group, a 1,1,2,2-tetrafluorobutanediyl group and a 1,1,2,2-tetrafluorohexanediyl group are still more preferred.

The monovalent radiation-degradable onium cation represented by $M^+$ is exemplified by radiation-degradable onium cations similar to those exemplified in connection with $Y^+$ in the formula (1) of the compound (A), and the like.

Examples of the acid generating agent (D) include compounds represented by the following formulae (vi-1) to (vi-17) (hereinafter, may be also referred to as "compounds (vi-1) to (vi-17)"), and the like.

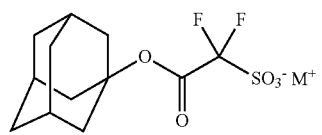
(vi-1)

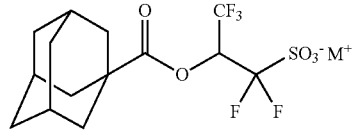
(vi-2)

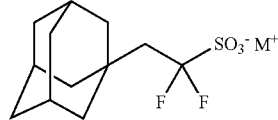
(vi-3)

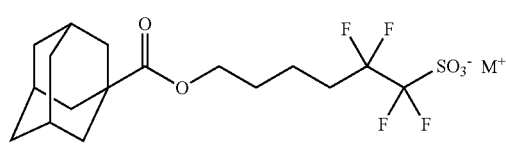
(vi-4)

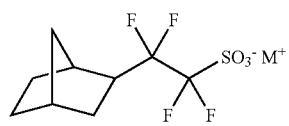
(vi-5)

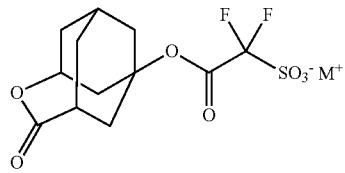
(vi-6)

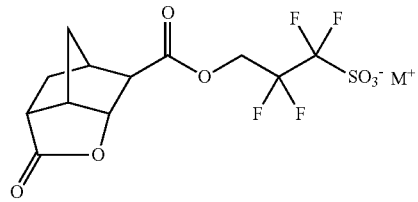
(vi-7)

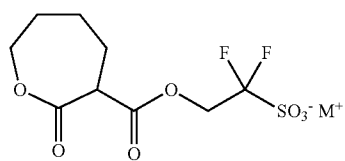
(vi-8)

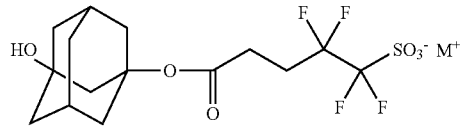
(vi-9)

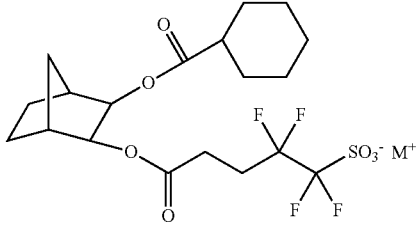
(vi-10)

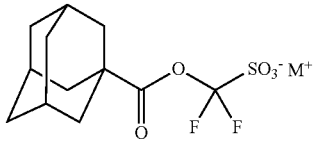
(vi-11)

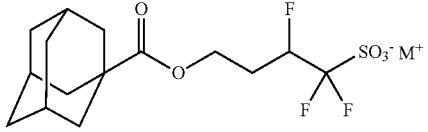
(vi-12)

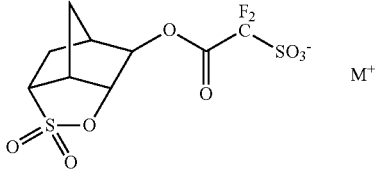
(vi-13)

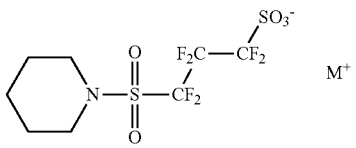
(vi-14)

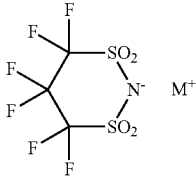
(vi-15)

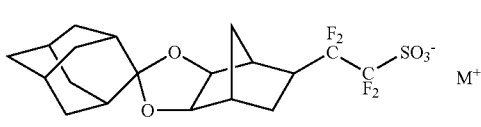
(vi-16)

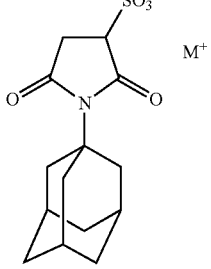
(vi-17)

As the acid generating agent (D), among these, onium salt compounds are preferred, sulfonium salts are more preferred, and compounds (vi-1) to (vi-3) and compounds (vi-13) to (vi-17) are still more preferred.

In a case where the acid generator (D) is the acid generating agent (D), the content of the acid generator (D) with respect to 100 parts by mass of the compound (A) is preferably 10 parts by mass to 500 parts by mass, more preferably 30 parts by mass to 400 parts by mass, and still more preferably 50 parts by mass to 300 parts by mass in light of an improvement of the sensitivity and the developability of the radiation-sensitive resin composition.

Moreover, the content of the acid generating agent (D) with respect to 100 parts by mass of the polymer (E) is preferably 0.1 parts by mass to 30 parts by mass, more preferably 0.5 parts by mass to 20 parts by mass, still more preferably 1 part by mass to 15 parts by mass, and particularly preferably 3 parts by mass to 15 parts by mass. One, or two or more types of the acid generator (D) may be used.

(E) Polymer

The polymer (E) has a content of fluorine atoms less than that of the fluorine atom-containing polymer (B) and includes an acid-labile group. The polymer (E) typically serves as a base polymer in the radiation-sensitive resin composition. The "base polymer" as referred to means a polymer that is a principal component among polymers constituting a resist pattern and accounts for preferably no less than 50% by mass, and more preferably no less than 60% by mass.

The polymer (E) preferably has a structural unit (III) that includes at least one selected from the group consisting of a lactone structure, a cyclic carbonate structure and a sultone structure, in addition to the structural unit that includes an acid-labile group (hereinafter, may be also referred to as "structural unit (II)"), and may include other structural unit(s) that is/are different from the structural units (II) and (III). The polymer (E) may include one, or two or more types of each of these structural units.

Structural Unit (II)

The structural unit (II) includes an acid-labile group. When the polymer (E) includes the structural unit (II), the sensitivity and the resolving ability of the radiation-sensitive resin composition may be improved, resulting in an improvement of the lithography performances. The "acid-labile group" as referred to means a group that substitutes a hydrogen atom included in a carboxy group, a hydroxy group and the like and is dissociated by an action of an acid.

Examples of the structural unit (II) include a structural unit represented by the following formula (2) (hereinafter, may be also referred to as "structural unit (II-1)"), and the like. The group represented by —$CR^5R^6R^7$ in the formula (2) of the structural unit (II-1) is an acid-labile group.

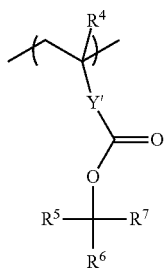

(2)

In the above formula (2), $R^4$ represents a hydrogen atom, a fluorine atom, a methyl group or a trifluoromethyl group; Y' represents a single bond, a carbonyloxyalkanediyl group having 2 to 20 carbon atoms, a carbonyloxycycloalkanediyl group having 4 to 20 carbon atoms, a carbonyloxycycloalkanediyloxy group having 4 to 20 carbon atoms, a arenediyl group having 6 to 20 carbon atoms, or a carbonyloxyarenediyl group having 7 to 20 carbon atoms; $R^5$ represents a hydrogen atom or a monovalent linear or branched hydrocarbon group having 1 to 10 carbon atoms; $R^6$ and $R^7$ each independently represent a monovalent linear or branched hydrocarbon group having 1 to 20 carbon atoms or a monovalent alicyclic hydrocarbon group having 3 to 20 carbon atoms, or $R^6$ and $R^7$ taken together represent an alicyclic structure having 3 to 20 ring atoms by binding with each other, together with the carbon atom to which $R^6$ and $R^7$ bond.

Examples of the carbonyloxyalkanediyl group having 2 to 20 carbon atoms which may be represented by Y' include a carbonyloxymethanediyl group, a carbonyloxyethanediyl group, a carbonyloxypropanediyl group, and the like.

Examples of the carbonyloxycycloalkanediyl group having 4 to 20 carbon atoms which may be represented by Y' include:

monocyclic carbonyloxycycloalkanediyl groups such as a carbonyloxycyclopropanediyl group, a carbonyloxycyclobutanediyl group, a carbonyloxycyclopentanediyl group and a carbonyloxycyclohexanediyl group;

polycyclic carbonyloxycycloalkanediyl groups such as a carbonyloxynorbornanediyl group, a carbonyloxyadamantanediyl group, a carbonyloxytricyclodecanediyl group and a carbonyloxytetracyclododecanediyl group; and the like.

Examples of the carbonyloxycycloalkanediyloxy group having 4 to 20 carbon atoms which may be represented by Y' include:

monocyclic carbonyloxycycloalkanediyloxy groups such as a carbonyloxycyclopropanediyloxy group, a carbonyloxycyclobutanediyloxy group, a carbonyloxycyclopentanediyloxy group and a carbonyloxycyclohexanediyloxy group;

polycyclic carbonyloxycycloalkanediyloxy groups such as a carbonyloxynorbornanediyloxy group, a carbonyloxyadamantanediyloxy group, a carbonyloxytricyclodecanediyloxy group and a carbonyloxytetracyclododecanediyloxy group; and the like.

Examples of the arenediyl group having 6 to 20 carbon atoms which may be represented by Y' include a benzenediyl group, a toluenediyl group, a xylenediyl group, a mesitylenediyl group, a naphthalenediyl group, an anthracenediyl group, and the like.

Examples of the carbonyloxyarenediyl group having 6 to 20 carbon atoms which may be represented by Y' include a carbonyloxybenzenediyl group, a carbonyloxytoluenediyl group, a carbonyloxyxylenediyl group, a carbonyloxymesityleneoxy group, a carbonyloxynaphthalenediyl group, a carbonyloxyanthracenediyl group, and the like.

Y' represents preferably a single bond, a carbonyloxyalkanediyl group having 2 to 20 carbon atoms, a carbonyloxycycloalkanediyloxy group having 4 to 20 carbon atoms, or an arenediyl group having 6 to 20 carbon atoms, more preferably a single bond, a carbonyloxymethanediyl group, a polycyclic carbonyloxycycloalkanediyloxy group, or a benzenediyl group, and still more preferably a single bond or a carbonyloxymethanediyl group.

$R^4$ represents preferably a hydrogen atom or a methyl group, and more preferably a methyl group in light of the copolymerizability of a monomer that gives the structural unit (II).

Examples of the monovalent linear or branched hydrocarbon group having 1 to 10 carbon atoms which may be represented by $R^5$, $R^6$ or $R^7$ include:

alkyl groups such as a methyl group, an ethyl group, a n-propyl group and an i-propyl group;

alkenyl groups such as an ethenyl group, a propenyl group and a butenyl group;

alkynyl groups such as an ethynyl group, a propynyl group and a butynyl group; and the like.

Examples of the monovalent alicyclic hydrocarbon group having 3 to 20 carbon atoms which may be represented by $R^5$, $R^6$ and $R^7$ include:

monocyclic cycloalkyl groups such as a cyclopentyl group and a cyclohexyl group;

monocyclic cycloalkenyl groups such as a cyclopentenyl group and a cyclohexenyl group;

polycyclic cycloalkyl groups such as a norbornyl group, an adamantyl group and a tricyclodecyl group;

polycyclic cycloalkenyl groups such as a norbornenyl group and a tricyclodecenyl group; and the like.

Examples of the alicyclic structure having 3 to 20 carbon atoms which may be taken together represented by $R^6$ and $R^7$ by binding with each other, together with the carbon atom to which $R^6$ and $R^7$ bond include:

monocyclic cycloalkane structures such as a cyclopropane structure, a cyclobutane structure, a cyclopentane structure, a cyclohexane structure, a cycloheptane structure and a cyclooctane structure;

polycyclic cycloalkane structures such as a norbornane structure, an adamantane structure, a tricyclodecane structure and a tetracyclododecane structure; and the like.

As the structural unit (II-1), structural units represented by the following formulae (2-1) to (2-5) (hereinafter, may be also referred to as "structural units (II-1-1) to (II-1-5)") are preferred.

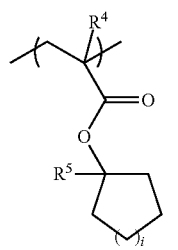
(2-1)

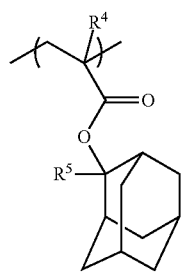
(2-2)

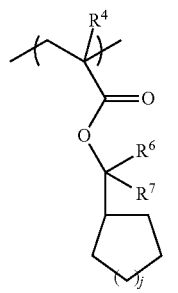
(2-3)

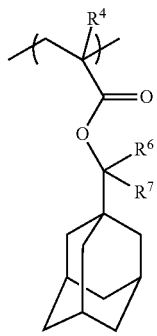
(2-4)

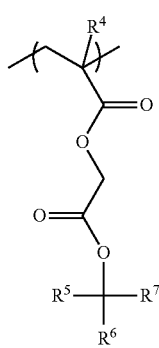
(2-5)

In the above formulae (2-1) to (2-5), $R^4$ to $R^7$ are as defined in the above formula (2); and i and j are each independently an integer of 1 to 4.

Examples of the structural units (II-1-1) to (II-1-5) include structural units represented by the following formulae, and the like.

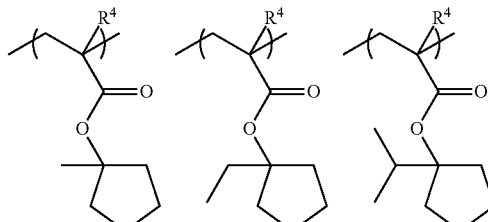

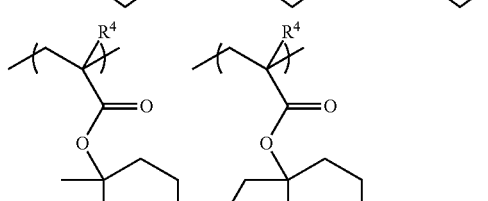

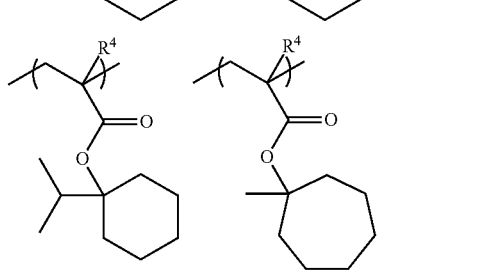

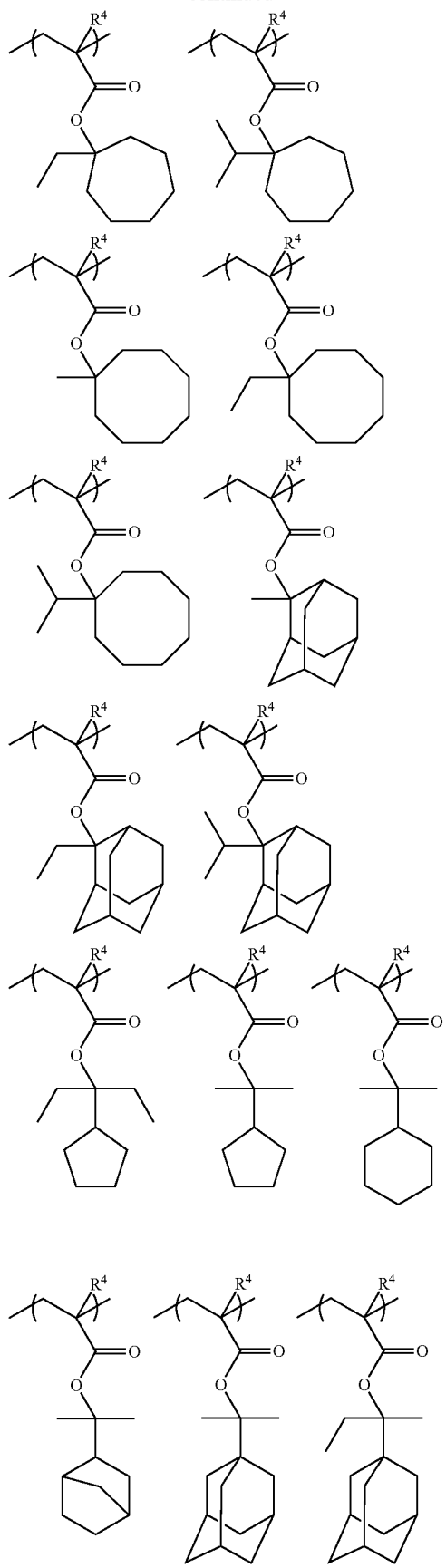
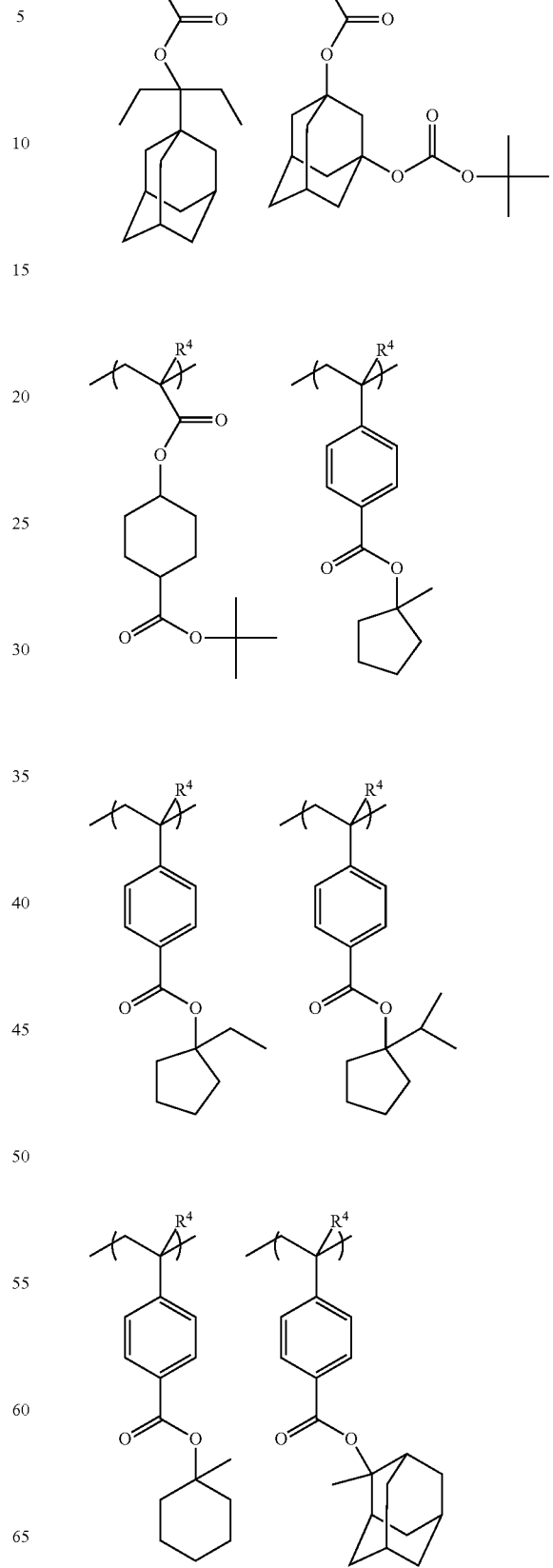

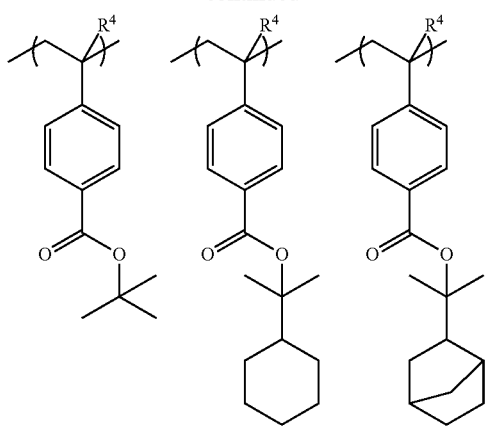
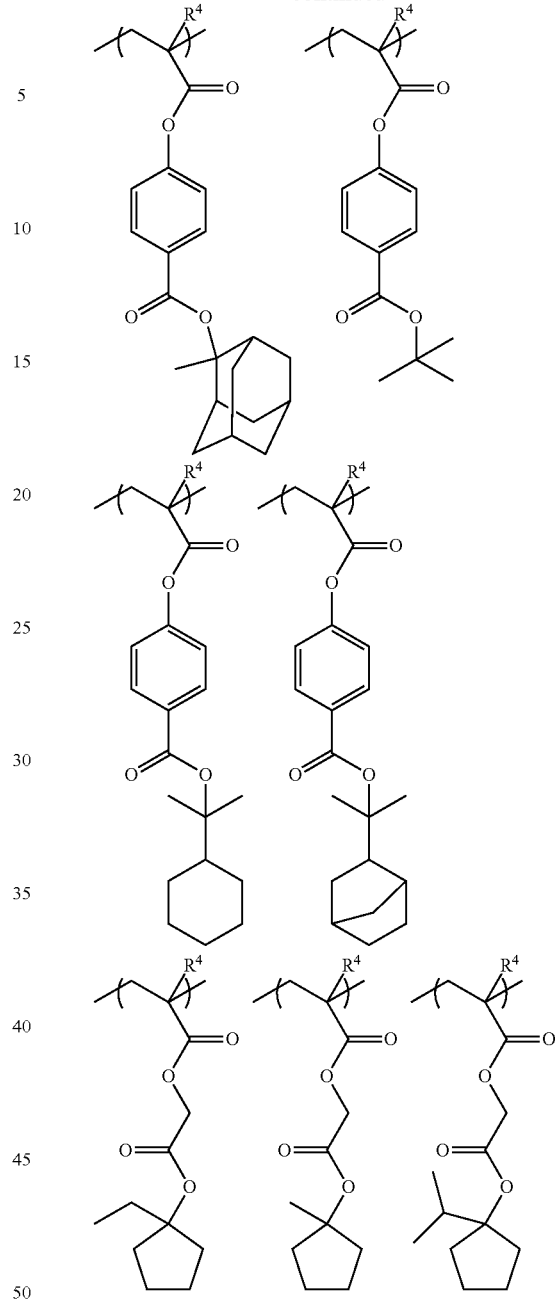

In the above formula, $R^4$ is as defined in the above formula (2).

The structural unit (II) is preferably a structural unit derived from 1-alkyl-monocyclic cycloalkan-1-yl (meth) acrylate, a structural unit derived from 2-alkyl-polycyclic cycloalkan-2-yl (meth)acrylate, a structural unit derived from 2-(cycloalkan-yl)propan-2-yl (meth)acrylate, or a structural unit derived from 1-alkyl-monocyclic cycloalkan-1-yloxycarbonylmethyl (meth)acrylate, and more preferably a structural unit derived from 1-methylcyclopentan-1-yl (meth)acrylate, a structural unit derived from 1-i-propylcyclopentan-1-yl (meth)acrylate, a structural unit derived from 2-(adamantan-1-yl)propan-2-yl (meth)acrylate, a structural unit derived from 2-(cyclohexan-1-yl)propan-2-yl (meth) acrylate, or a structural unit derived from 1-ethylcyclopentan-1-yloxycarbonylmethyl (meth)acrylate.

The proportion of the structural unit (II) with respect to the total structural units constituting the polymer (E) is preferably 10 mol % to 80 mol %, more preferably 20 mol % to 75 mol %, still more preferably 30 mol % to 70 mol %, and particularly preferably 35 mol % to 60 mol %. When the proportion of the structural unit (II) falls within the above range, the lithography performances of the radiation-sensitive resin composition may be further improved. When the aforementioned proportion is less than the lower limit, the pattern formability of the radiation-sensitive resin composition may be deteriorated. When the aforementioned proportion is greater than the upper limit, the adhesiveness of the resist pattern to a substrate may be deteriorated.

Structural Unit (III)

The structural unit (III) includes at least one selected from the group consisting of a lactone structure, a cyclic carbonate structure and a sultone structure. When the polymer (E) further has the structural unit (III), the solubility thereof in a developer solution can be further adjusted, resulting in an improvement of the lithography performances of the radiation-sensitive resin composition. In addition, the adhesiveness between the resist pattern formed from the radiation-sensitive resin composition and a substrate may be increased.

Examples of the structural unit (III) that includes a lactone structure include structural units represented by the following formulae (3-1-1) to (3-1-17) (hereinafter, may be also referred to as "structural units (III-1-1) to (III-1-17)"), and the like; examples of the structural unit (III) that includes a cyclic carbonate structure include structural units represented by the following formulae (3-2-1) to (3-2-17) (hereinafter, may be also referred to as "structural units (III-2-1) to (III-2-17)"), and the like; and examples of the structural unit (III) that includes a sultone structure include structural units represented by the following formulae (3-3-1) to (3-3-11) (hereinafter, may be also referred to as "structural unit (III-3-1) to (III-3-11)"), and the like.

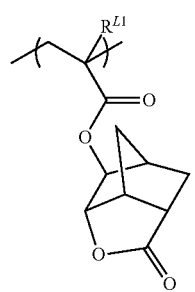

(3-1-1)

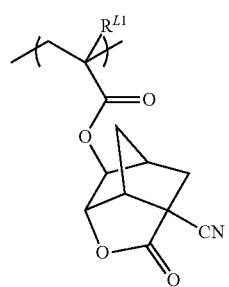

(3-1-2)

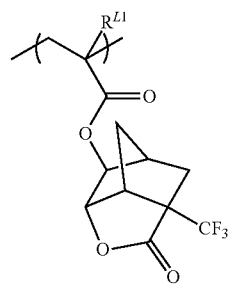

(3-1-3)

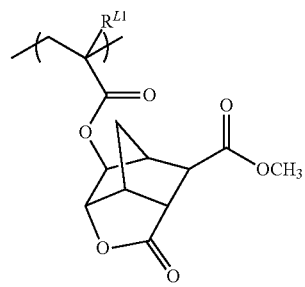

(3-1-4)

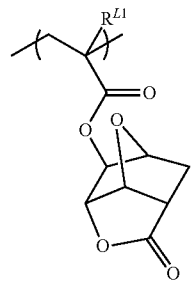

(3-1-5)

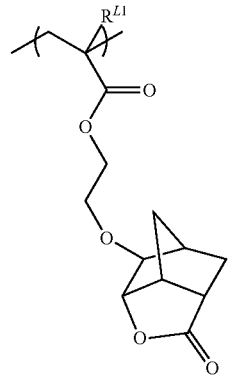

(3-1-6)

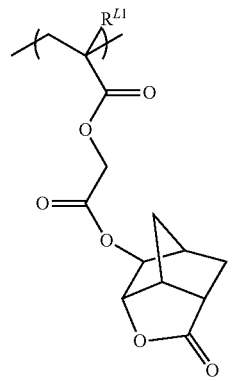

(3-1-7)

-continued
(3-1-8)
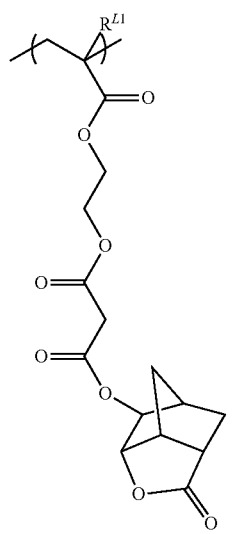
(3-1-9)
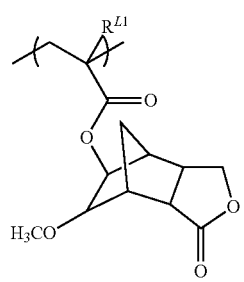
(3-1-10)
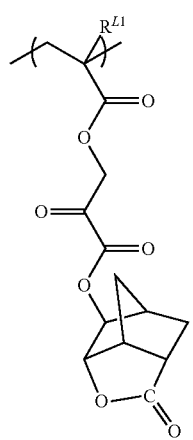
(3-1-11)
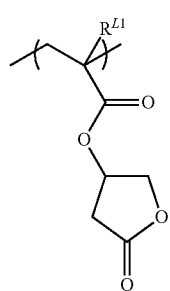
-continued
(3-1-12)
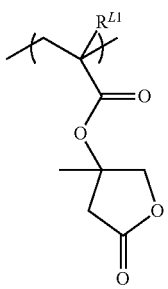
(3-1-13)
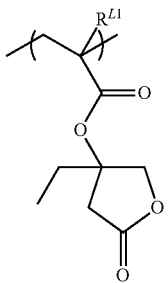
(3-1-14)
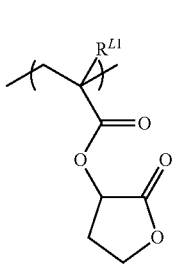
(3-1-15)
(3-1-16)
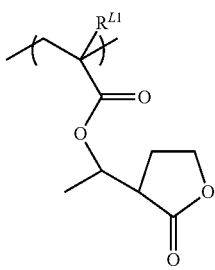
(3-1-17)

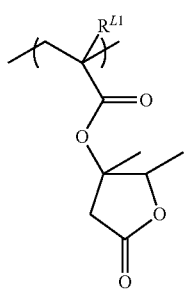
(3-1-18)
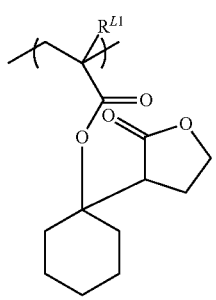
(3-1-19)
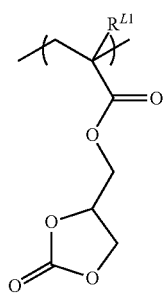
(3-2-1)
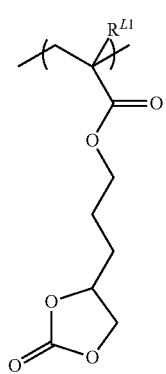
(3-2-2)
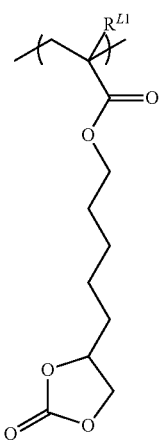
(3-2-3)
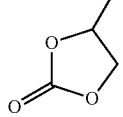
(3-2-4)
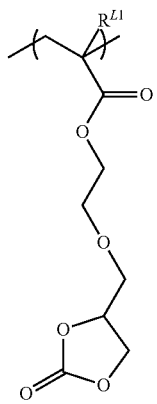
(3-2-5)
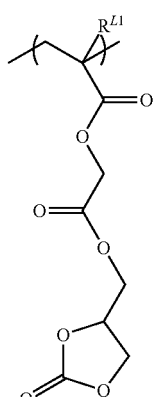
(3-2-6)

(3-2-7) 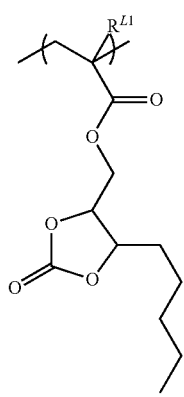
(3-2-8) 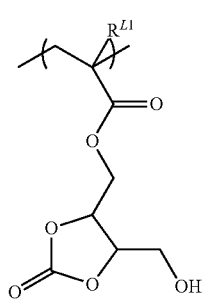
(3-2-9) 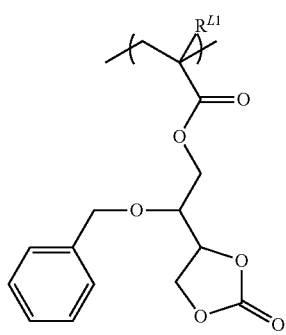
(3-2-10) 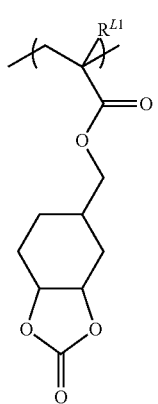
(3-2-11) 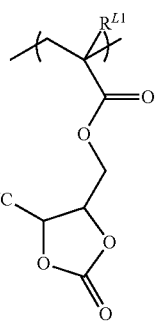
(3-2-12) 
(3-2-13) 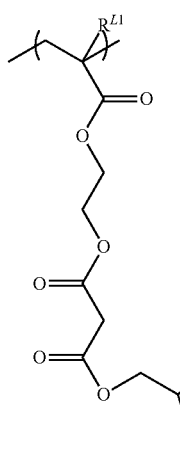
(3-2-14) 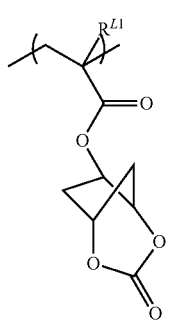

(3-2-15) 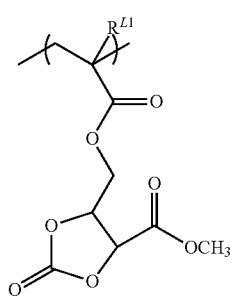
(3-2-16) 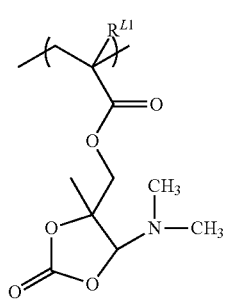
(3-2-17) 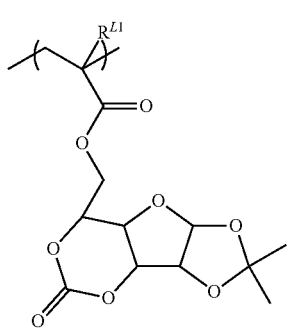
(3-3-1) 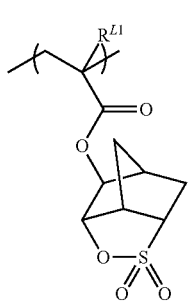
(3-3-2) 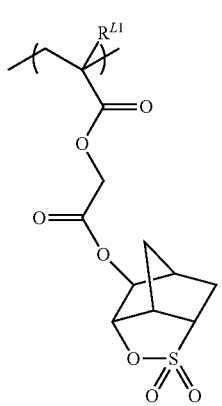
(3-3-3) 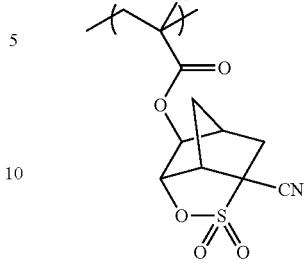
(3-3-4) 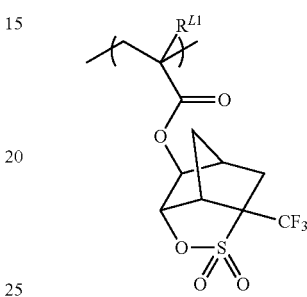
(3-3-5) 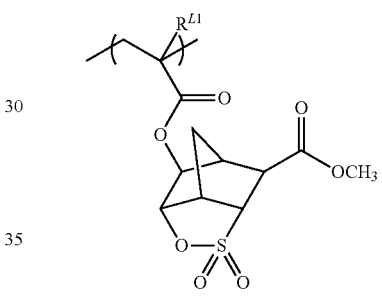
(3-3-6) 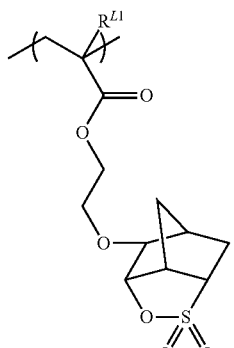
(3-3-7) 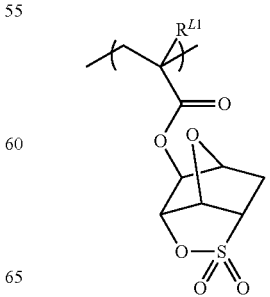

-continued (3-3-8)
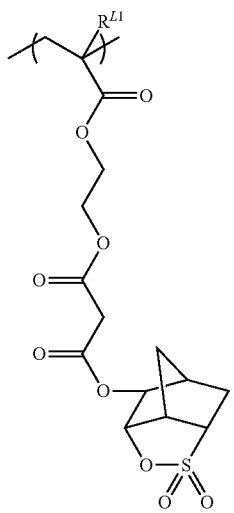

(3-3-9)
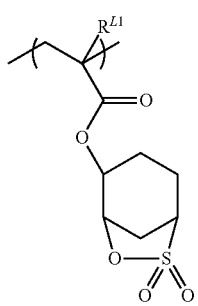

(3-3-10)
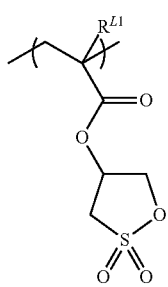

(3-3-11)
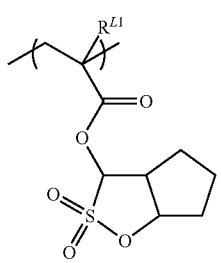

In the above formulae, $R^{L1}$ represents a hydrogen atom, a fluorine atom, a methyl group or a trifluoromethyl group.

As the structural unit (III), the structural units (III-1-1), (III-1-2), (III-1-5), (III-1-7), (III-1-10), (III-1-13), (III-1-19), (III-2-1) and (III-3-1) are more preferred.

The proportion of the structural unit (III) with respect to the total structural units in the polymer (E) is preferably no greater than 80 mol %, more preferably 10 mol % to 70 mol %, and still more preferably 20 mol % to 60 mol %. When the proportion of the structural unit (III) falls within the above range, the lithography performances of the radiation-sensitive resin composition may be further improved. In addition, the adhesiveness between the resulting resist pattern and a substrate may be further improved.

The polymer (E) may have other structural unit(s) in addition to the structural units (II) and (III). Examples of the other structural unit(s) include: a structural unit that includes at least one selected from the group consisting of a hydroxy group, a ketonic carbonyl group, a cyano group, a carboxy group, a nitro group and an amino group; a structural unit that includes an acid-nonlabile alicyclic hydrocarbon group, e.g., a structural unit derived from tricyclodecyl (meth) acrylate; and the like. Among these, a structural unit that includes a hydroxy group is preferred, and a structural unit derived from 3-hydroxyadamantan-1-yl (meth)acrylate, and a structural unit derived from 1-oxa-2-oxo-3-methylene-8-hydroxyspiro[4,5]decane are preferred. The proportion of these structural units is preferably no greater than 30 mol %, and more preferably no greater than 20 mol %.

The content of the polymer (E) with respect to 100 parts by mass of the compound (A) is preferably 100 parts by mass to 10,000 parts by mass, more preferably 300 parts by mass to 6,000 parts by mass, and still more preferably 500 parts by mass to 4,000.

In addition, the content of the polymer (E) with respect to the total solid content of the radiation-sensitive resin composition is preferably no less than 70% by mass, more preferably no less than 80% by mass, and still more preferably no less than 85% by mass.

The polymer (E) can be synthesized in accordance with a method similar to that for the fluorine atom-containing polymer (B) as described above.

Although the polystyrene equivalent weight average molecular weight (Mw) of the polymer (E) as determined by gel permeation chromatography (GPC) is not particularly limited, the Mw is preferably no less than 1,000 and no greater than 50,000, more preferably no less than 2,000 and no greater than 30,000, still more preferably no less than 3,000 and no greater than 20,000, and particularly preferably 3,500 no less than 15,000. When the Mw of the polymer (E) falls within the above range, the coating property and the development defect inhibitory ability of the radiation-sensitive resin composition may be improved. When the Mw of the polymer (E) is less than the lower limit, a resist film exhibiting sufficient heat resistance may not be obtained. When the Mw of the polymer (E) is greater than the upper limit, the developability of the resist film may be deteriorated.

The ratio (Mw/Mn) of Mw to the polystyrene equivalent number average molecular weight (Mn) as determined by GPC of the polymer (E) is typically no less than 1 and no greater than 5, preferably no less than 1 and no greater than 3, and still more preferably no less than 1 and no greater than 2.

Other Optional Component(s)

The radiation-sensitive resin composition may contain other optional component(s) in addition to the aforementioned components (A) to (E). The other optional component(s) is/are exemplified by other acid diffusion controller excluding the compound (A), a surfactant, an alicyclic skeleton-containing compound, a sensitizing agent, and the like. These other optional components each may be used either alone, or in combination of two or more types thereof.

Other Acid Diffusion Controller

The radiation-sensitive resin composition according to the embodiment of the present invention may contain other acid diffusion controller excluding the compound (A), within a range not leading to impairment of the effects of the present invention.

The other acid diffusion controller controls a diffusion phenomenon of the acid generated from the acid generator (D) upon an exposure in the resist film. As a result, the other acid diffusion controller exhibits the effect of inhibiting unfavorable chemical reactions in an unexposed region. In addition, a further improvement of the storage stability of the resulting radiation-sensitive resin composition may be attained. Moreover, a resolving ability for use as a resist is further improved, and variations of the line widths of the resist pattern caused by variations of post exposure time delay from the exposure until a development treatment can be inhibited, whereby a radiation-sensitive resin composition exhibiting superior process stability can be obtained. The mode of incorporation of the other acid diffusion controller in the radiation-sensitive resin composition may be in a free compound form (hereinafter, may be also referred to as "other acid diffusion control agent", as appropriate), or in an incorporated form as a part of the polymer, or in both of these forms.

The other acid diffusion control agent is exemplified by: a compound represented by the following formula (vii) (hereinafter, may be also referred to as "nitrogen-containing compound (I)"); a compound having two nitrogen atoms within a single molecule (hereinafter, may be also referred to as "nitrogen-containing compound (II)"); a compound having three nitrogen atoms (hereinafter, may be also referred to as "nitrogen-containing compound (III)"); an amide group-containing compound; a urea compound; a nitrogen-containing heterocyclic compound; and the like.

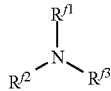

(vii)

In the above formula (vii), $R^{/1}$, $R^{/2}$ and $R^{/3}$ each independently represent a hydrogen atom, or a linear, branched or cyclic alkyl group, an aryl group or an aralkyl group each unsubstituted or substituted.

Examples of the nitrogen-containing compound (I) include monoalkylamines such as n-hexylamine; dialkylamines such as di-n-butylamine; trialkylamines such as triethylamine and tri-n-pentylamine; aromatic amines such as aniline; and the like.

Examples of the nitrogen-containing compound (II) include ethylenediamine, N,N,N',N'-tetramethylethylenediamine, and the like.

Examples of the nitrogen-containing compound (III) include: polyamine compounds such as polyethyleneimine and polyallylamine; polymers of dimethylaminoethylacrylamide, etc.; and the like.

Examples of the amide group-containing compound include formamide, N-methylformamide, N,N-dimethylformamide, acetamide, N-methylacetamide, N,N-dimethylacetamide, propionamide, benzamide, pyrrolidone, N-methylpyrrolidone, and the like.

Examples of the urea compound include urea, methylurea, 1,1-dimethylurea, 1,3-dimethylurea, 1,1,3,3-tetramethylurea, 1,3-diphenylurea, tributylthiourea, and the like.

Examples of the nitrogen-containing heterocyclic compound include: pyridines such as pyridine and 2-methylpyridine; morpholines such as N-propylmorpholine and N-(undecan-1-ylcarbonyloxyethyl)morpholine; pyrazine; pyrazole; and the like.

A compound that includes an acid-labile group may also be used as the nitrogen-containing organic compound. Examples of the nitrogen-containing organic compound that includes an acid-labile group include N-t-butoxycarbonylpiperidine, N-t-butoxycarbonylimidazole, N-t-butoxycarbonylbenzimidazole, N-t-butoxycarbonyl-2-phenylbenzimidazole, N-(t-butoxycarbonyl)di-n-octylamine, N-(t-butoxycarbonyl)diethanolamine, N-(t-butoxycarbonyl)dicyclohexylamine, N-(t-butoxycarbonyl)diphenylamine, N-t-butoxycarbonyl-4-hydroxypiperidine, N-t-amyloxycarbonyl-4-hydroxypiperidine, and the like.

In addition, as the other acid diffusion controller, a photodegradable base that is sensitized upon an exposure to generate a weak acid may be used. The photodegradable base is exemplified by an onium salt compound that is degraded upon the exposure and loses its acid diffusion controllability, and the like (excluding those corresponding to the compound (A)).

In a case where the other acid diffusion controller is the other acid diffusion control agent, the content of the other acid diffusion controller with respect to 100 parts by mass of the polymer (E) is preferably 0 parts by mass to 20 parts by mass, more preferably 0.1 parts by mass to 15 parts by mass, still more preferably 0.3 parts by mass to 10 parts by mass, and particularly preferably 0.5 parts by mass to 5 parts by mass. When the content of the other acid diffusion controller is greater than the upper limit, the sensitivity of the radiation-sensitive resin composition may be deteriorated.

Surfactant

The surfactant exhibits the effect of improving a coating property, striation, developability, and the like. Examples of the surfactant include: nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate and polyethylene glycol distearate; and commercially available products such as "KP341" supplied by Shin-Etsu Chemical Co., Ltd., "Polyflow No. 75" and "Polyflow No. 95" each supplied by Kyoeisha Chemical Co., Ltd., "EFTOP EF301", "EFTOP EF303" and "EFTOP EF352" each supplied by Tochem Products Co. Ltd., "Megaface F171" and "Megaface F173" each supplied by DIC Corporation, "Fluorad FC430" and "Fluorad FC431" each supplied by Sumitomo 3M Limited, and "ASAHI GUARD AG710", "Surflon S-382", "Surflon SC-101", "Surflon SC-102", "Surflon SC-103", "Surflon SC-104", "Surflon SC-105" and "Surflon SC-106" each supplied by Asahi Glass Co., Ltd.; and the like. The content of the surfactant in the radiation-sensitive resin composition with respect to 100 parts by mass of the polymer (E) is typically no greater than 2 parts by mass.

Alicyclic Skeleton-Containing Compound

The alicyclic skeleton-containing compound exhibits the effect of improving dry etching resistance, a pattern configuration, adhesiveness to a substrate, and the like.

Sensitizing Agent

The sensitizing agent exhibits the action of increasing the amount of an acid generated from the acid generator (D) and the like, and consequently exerts the effect of improving "apparent sensitivity" of the radiation-sensitive resin composition.

Examples of the sensitizing agent include carbazoles, acetophenones, benzophenones, naphthalenes, phenols, biacetyl, eosin, rose bengal, pyrenes, anthracenes, phenothiazines, and the like. These sensitizing agents may be used either alone, or in combination of two or more types thereof. The content of the sensitizing agent in the radiation-sensitive resin composition with respect to 100 parts by mass of the polymer (E) is typically no greater than 2 parts by mass.

Preparation Method of Radiation-Sensitive Resin Composition

The radiation-sensitive resin composition according to the embodiment of the present invention may be prepared, for example, by mixing the compound (A), the fluorine atom-containing polymer (B) and the solvent (C), as well as the acid generator (D), the polymer (E) and the like each contained as needed, in a predetermined ratio. After the mixing, the radiation-sensitive resin composition is preferably filtered through a filter with a pore size of about 0.2 µm, for example. The solid content concentration of the radiation-sensitive resin composition is typically 0.1% by mass to 50% by mass, preferably 0.5% by mass to 30% by mass, and more preferably 1% by mass to 20% by mass.

The radiation-sensitive resin composition according to the embodiment of the present invention can be used in positive-type pattern formation in which an alkaline developer solution is employed and negative-type pattern formation in which a developer solution containing an organic solvent is employed. Of these, when being used in the negative-type pattern formation in which a developer solution containing an organic solvent is employed, the radiation-sensitive resin composition can exhibit more superior resolving ability.

Resist Pattern Forming Method

A resist pattern forming method according to another embodiment of the present invention includes:

providing a resist film using the radiation-sensitive resin composition according to the embodiment of the present invention (hereinafter, may be also referred to as "resist film-providing step");

exposing the resist film through a liquid immersion medium (hereinafter, may be also referred to as "liquid immersion exposure step"); and developing the resist film exposed through the liquid immersion medium (hereinafter, may be also referred to as "development step").

Resist Film-Providing Step

In this step, a resist film is provided using the radiation-sensitive resin composition according to the embodiment of the present invention.

Examples of the substrate on which the resist film is provided include silicon wafers, wafers covered with aluminum, and the like. The resist film is provided on the substrate by coating the radiation-sensitive resin composition on the substrate. Although the method for coating the radiation-sensitive resin composition is not particularly limited, the radiation-sensitive resin composition may be coated by a well-known method such as, for example, a spin coating method. In the coating of the radiation-sensitive resin composition, the amount of the radiation-sensitive resin composition coated is adjusted such that the resist film provided has a desired film thickness. It is to be noted that after the radiation-sensitive resin composition is coated on the substrate, soft baking (hereinafter, may be also referred to as "SB") may be carried out in order to permit the volatilization of the solvent. The temperature of soft baking is typically 30° C. to 200° C., preferably 50° C. to 150° C.

Liquid Immersion Exposure Step

In this step, the resist film provided in the resist film-providing step is exposed through a liquid immersion medium. The exposure is typically carried out by placing a liquid immersion medium on the resist film, and irradiating the resist film with a radioactive ray through the liquid immersion medium.

A liquid that has a refractive index greater than that of air is typically used as the liquid immersion medium. Specific examples thereof include pure water, a long chain or cyclic aliphatic compound, and the like. In the presence of the intervening liquid immersion medium, more specifically, in a state in which a space between a lens and the resist film is filled with the liquid immersion medium, a radioactive ray is emitted from an exposure system to expose the resist film through a mask having a predetermined pattern.

The radioactive ray used may be appropriately selected from a visible light ray, an ultraviolet ray, a far ultraviolet ray, an X-ray, a charged particle ray and the like, in accordance with the type of the radiation-sensitive acid generator employed, and among these, far ultraviolet rays typified by an ArF excimer laser beam (wavelength: 193 nm) and a KrF excimer laser beam (wavelength: 248 nm) are preferred, and an ArF excimer laser beam (wavelength: 193 nm) is more preferred. It is to be noted that exposure conditions such as an exposure dose may be appropriately selected in accordance with the blend composition of the resist composition for liquid immersion lithography, the type of additive(s), and the like.

In the present invention, a heat treatment (hereinafter, may be also referred to as "PEB") is preferably carried out after the exposure. The PEB allows a dissociation reaction of the acid-labile group in the resin component to smoothly proceed. The baking conditions for PEB may be appropriately adjusted in accordance with the blend composition of the resist composition for liquid immersion lithography, and is adjusted to typically 30° C. to 200° C., and preferably 50° C. to 170° C.

In addition, In order to maximize the potentiality of the radiation-sensitive resin composition, an organic or inorganic antireflective film may be provided on the substrate to be used, as disclosed in, for example, Japanese Examined Patent Application, Publication No. H6-12452 (Japanese Unexamined Patent Application, Publication No. S59-93448), and the like. Further, in order to eliminate the influence of basic impurities or the like contained in an environmental atmosphere, a protective film may be provided on the resist film, as disclosed in, for example, Japanese Unexamined Patent Application, Publication No. H5-188598, and the like.

Development Step

In this step, the resist film exposed through the liquid immersion medium in the liquid immersion exposure step is developed. A resist pattern is thereby formed.

In regard to the developer solution used in the development, as an alkaline developer solution, an aqueous alkaline solution prepared by dissolving at least one of alkaline compounds such as, for example, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene and 1,5-diazabicyclo-[4.3.0]-5-nonene is preferred. It is to be noted that a water-soluble organic solvent such as an alcohol, e.g., methanol and ethanol, and a surfactant may be added to the developer solution in an appropriate amount.

Alternatively, as the developer solution, a developer solution containing an organic solvent may be used. Examples of the organic solvent include one, or two or more types of the organic solvents exemplified in connection with the solvent (C) of the radiation-sensitive resin composition.

EXAMPLES

Hereinafter, the present invention is explained in detail by way of Examples, but the present invention is not in any way limited by these Examples. Measuring methods for various types of physical properties are shown below.

Determination of Weight Average Molecular Weight (Mw), Number Average Molecular Weight (Mn) and Dispersity Index (Mw/Mn)

The determination was carried out by gel permeation chromatography (GPC) using GPC columns ("G2000HXL" ×2, "G3000HXL" ×1, and "G4000HXL" ×1) each supplied by Tosoh Corporation and mono-dispersed polystyrene as a standard, under analytical conditions involving: flow rate of 1.0 mL/min; elution solvent of tetrahydrofuran; and column temperature of 40° C.

$^1$H-NMR Analysis and $^{13}$C-NMR Analysis

The analyses were carried out using "JNM-Delta400" supplied by JEOL, Ltd.

Synthesis of Compound (A)

Synthesis Example 1

A compound represented by the following formula (A'-1) (40 mmol) was dissolved in water, and the mixture was stirred for 30 min. To this was added an aqueous solution of a compound represented by the following formula (A'-2) (30 mmol), and the mixture was stirred for 1.5 hrs. To the reaction liquid was added 500 g of methylene chloride, and the mixture was further stirred for 1 hour. Then, the methylene chloride layer was recovered, and washed five times with 500 g of water. Thereafter, methylene chloride was distilled off under reduced pressure, and drying was carried out to obtain a compound represented by the following formula (A-1).

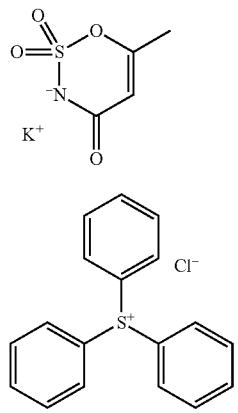

The results of the $^1$H-NMR measurement of the compound (A-1) obtained are shown below. It is to be noted that a sample for the measurement was prepared by dissolving the obtained compound (A-1) (0.03 mmol) in deuterated dimethyl sulfoxide (1.0 mL).

$^1$H-NMR (400 MHz; solvent: DMSO-d$_6$; internal standard: TMS): δ (ppm): 7.75-7.90 (15H, m), 5.25 (1H, s), 1.90 (3H, s).

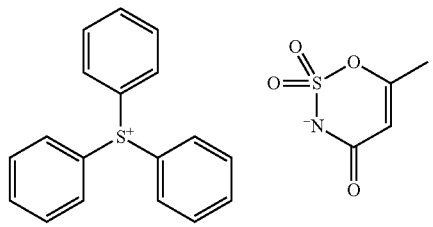

Synthesis Examples 2 and 3

A compound represented by the following formula (A-2) and a compound represented by the following formula (A-3) were synthesized in a similar manner to Synthesis Example 1 described above.

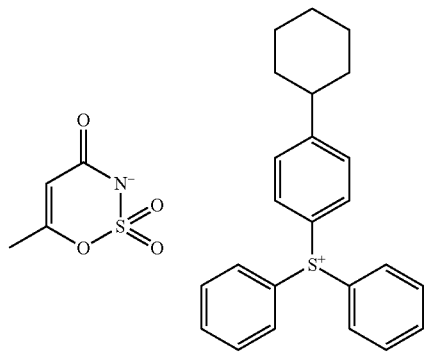

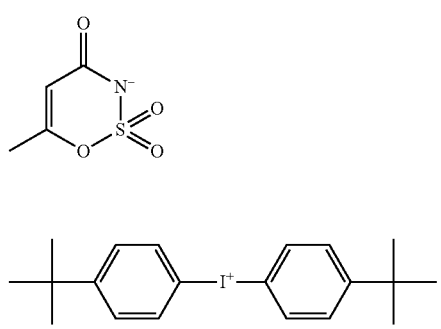

Synthesis of Polymers

Compounds used in the synthesis of the fluorine atom-containing polymer (B) and the polymer (E) are shown below.

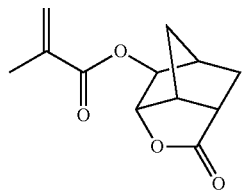

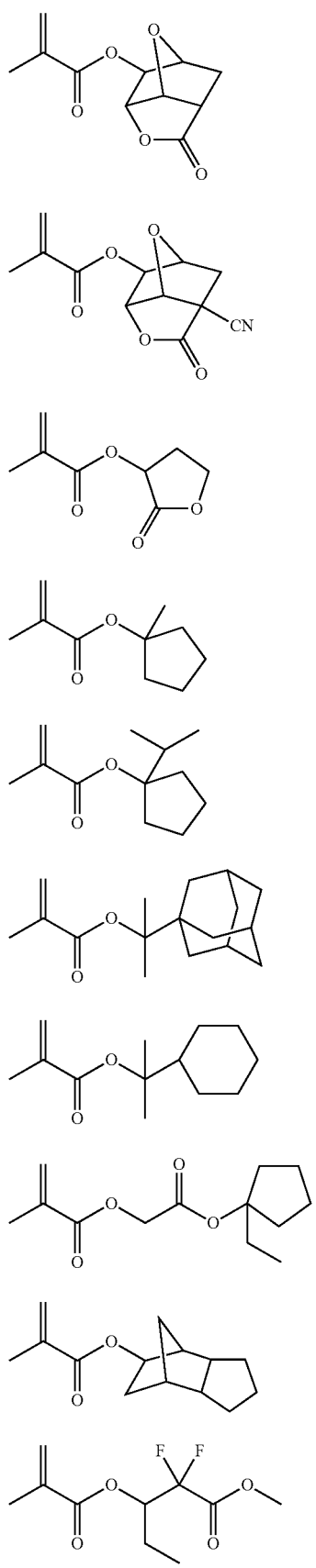
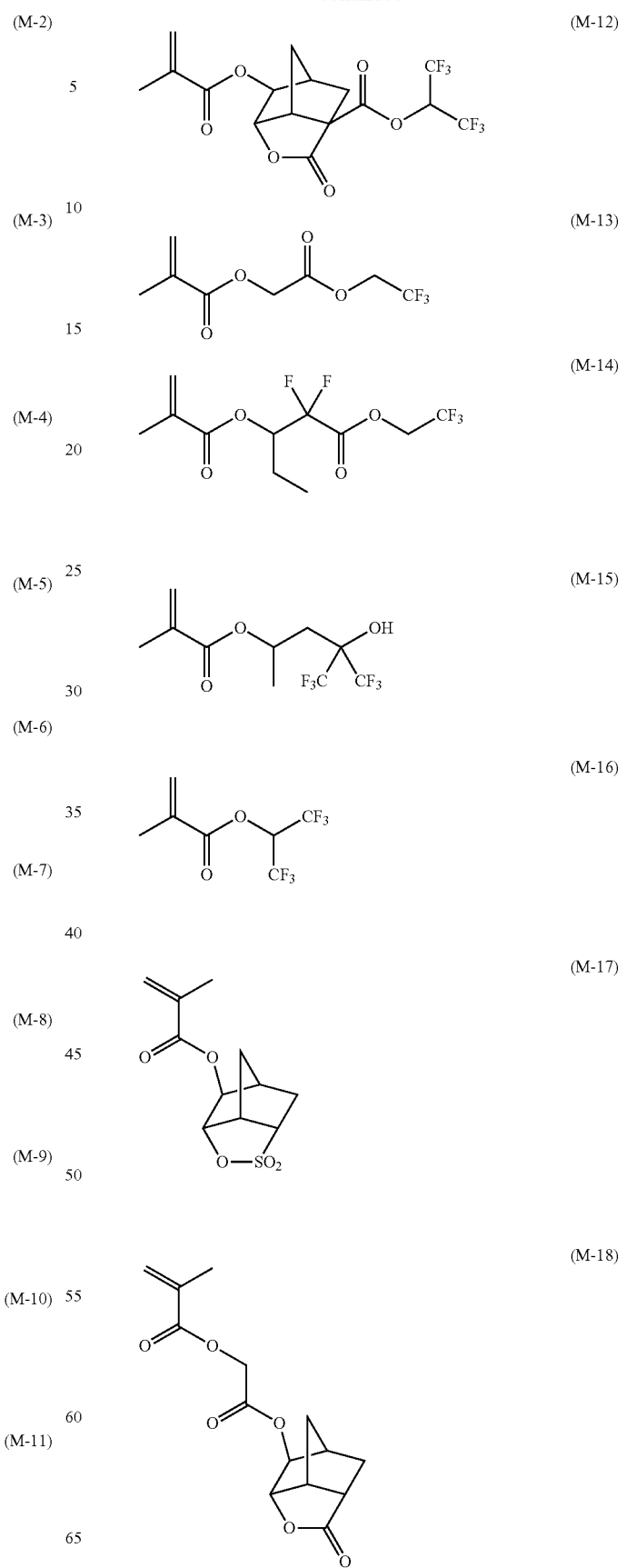

(M-19)
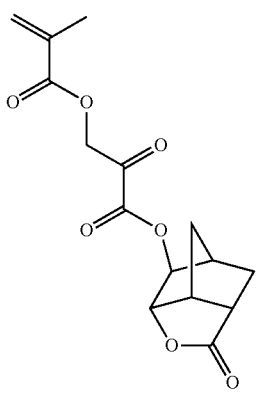

(M-20)
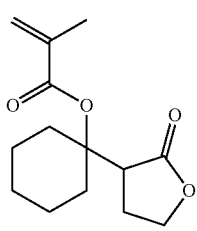

(M-21)
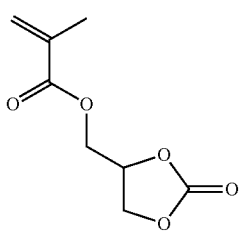

(M-22)
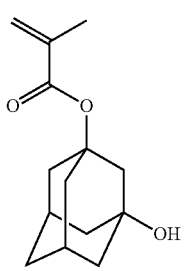

(M-23)
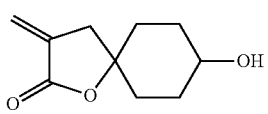

(M-24)
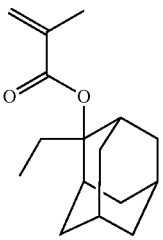

Synthesis of Fluorine Atom-Containing Polymer (B)

Synthesis Example 4: Synthesis of Polymer (B-1)

The compound (M-6) in an amount of 2.63 g (30 mol %) and the compound (M-11) in an amount of 7.37 g (70 mol %) were dissolved in 20 g of 2-butanone, and 0.59 g of 2,2'-azobis(2-isobutyronitrile) (8 mol % with respect to the total amount of the compounds) was further charged into a 200 mL three-neck flask. After nitrogen-purging was carried out for 30 min, the reaction vessel was heated to 80° C. with stirring, whereby the polymerization reaction was allowed to proceed for 6 hrs, in which the time of the start of the heating was regarded as the time of the start of the polymerization reaction. After the completion of the polymerization, the polymerization reaction liquid was cooled to 30° C. or below through water-cooling, and concentrated under reduced pressure in an evaporator until the mass of the polymerization reaction liquid was reduced to 15 g. The obtained concentrated liquid was slowly charged into 200 g of n-hexane cooled to 0° C. to permit the solid content to be deposited. The mixed liquid was decanted to remove the liquid portion, and the solid content was washed three times with n-hexane. The obtained polymer was dissolved in propylene glycol monomethyl ether acetate, and the mixture was concentrated in an evaporator to obtain 65 g of a propylene glycol monomethyl ether acetate solution of a polymer (B-1) (yield: 65%), with a solid content concentration thereof being 10% by mass. The polymer (B-1) had an Mw of 4,300 and an Mw/Mn of 1.51. In addition, the results of $^{13}$C-NMR analysis indicated that the proportions of the structural units derived from (M-6) and (M-11) were 26 mol % and 74 mol %, respectively.

Synthesis Examples 5 to 9: Synthesis of Polymers (B-2) to (B-6)

Each polymer was synthesized in a similar manner to Synthesis Example 4 except that the compound (monomer) of the type and the amount shown in Table 1 were used. The yield (%), the Mw and the Mw/Mn of each polymer synthesized are shown in Table 1 in all. The total mass of the compounds used was 10 g. The proportions of each structural unit (mol %), the yield (%), the Mw and the Mw/Mn of the synthesized polymer are shown in Table 1 in all.

TABLE 1

| | (B) Polymer | Monomer giving structural unit (I) | | | Monomer giving structural unit (II) | | | Yield (%) | Mw | Mw/Mn |
| | | type | amount (mol %) | proportion of structural unit (mol %) | type | amount (mol %) | proportion of structural unit (mol %) | | | |
| --- | --- | --- | --- | --- | --- | --- | --- | --- | --- | --- |
| Synthesis Example 4 | B-1 | M-11 | 70 | 74 | M-6 | 30 | 26 | 65 | 4,300 | 1.51 |

TABLE 1-continued

| | (B) Polymer | Monomer giving structural unit (I) | | | Monomer giving structural unit (II) | | | Yield (%) | Mw | Mw/Mn |
|---|---|---|---|---|---|---|---|---|---|---|
| | | type | amount (mol %) | proportion of structural unit (mol %) | type | amount (mol %) | proportion of structural unit (mol %) | | | |
| Synthesis Example 5 | B-2 | M-12 | 70 | 76 | M-6 | 30 | 24 | 63 | 4,500 | 1.53 |
| Synthesis Example 6 | B-3 | M-13 | 70 | 74 | M-6 | 30 | 26 | 64 | 4,400 | 1.52 |
| Synthesis Example 7 | B-4 | M-14 | 70 | 74 | M-6 | 30 | 26 | 65 | 4,300 | 1.5 |
| Synthesis Example 8 | B-5 | M-13 M-16 | 60 10 | 63 12 | M-6 | 30 | 25 | 66 | 4,500 | 1.56 |
| Synthesis Example 9 | B-6 | M-15 M-16 | 60 10 | 65 10 | M-6 | 30 | 25 | 64 | 4,400 | 1.52 |

Synthesis of Polymer (E)

Synthesis Example 10: Synthesis of Polymer (E-1)

A monomer solution was prepared by dissolving 43.08 g (50 mol %) of the compound (M-5), 56.92 g (50 mol %) of the compound (M-1) and 4.20 g of 2,2'-azobis(2-isobutyronitrile) (5 mol % with respect to the total amount of the compounds) in 200 g of 2-butanone. Separately, 100 g of 2-butanone was charged into a 1,000 mL three-neck flask, and nitrogen-purging was carried out for 30 min, and then the reaction vessel was heated to 80° C. with stirring. To this, the monomer solution was added dropwise over 4 hrs, and after the completion of the dropwise addition, the mixture was aged at 80° C. for 3 hrs. After the completion of the polymerization, the polymerization reaction liquid was cooled to 30° C. or below through water-cooling. Thereafter, the polymerization reaction liquid was poured into 2,000 g of methanol to permit a reprecipitation operation. The slurry obtained after the deposition was subjected to suction filtration and separation, and the solid content was washed three times with methanol. The solid content was dried under reduced pressure at 60° C. for 15 hrs to obtain 75.0 g of a polymer (E-1) as a white powder (yield: 75%). The polymer (E-1) had an Mw of 5,300 and an Mw/Mn of 1.32. In addition, the results of $^{13}$C-NMR analysis indicated that the proportions of the structural units derived from (M-5) and (M-1) were 49 mol % and 51 mol %, respectively.

Synthesis Examples 11 to 25: Synthesis of Polymers (E-2) to (E-16)

Each polymer was synthesized in a similar manner to Synthesis Example 10 except that the compounds (monomers) of the type and the amount shown in Table 2. The proportion of each structural unit (mol %), the yield (%), the Mw and the Mw/Mn of the polymer synthesized are shown in Table 2 in all. The total mass of the compounds used was 100 g. It is to be noted that "-" in Table 2 indicates that the relevant compound was not used.

TABLE 2

| | (E) Polymer | Monomer giving structural unit (II) | | | Monomer giving structural unit (III) | | | Monomer giving other structural unit | | | Yield (%) | Mw | Mw/Mn |
|---|---|---|---|---|---|---|---|---|---|---|---|---|---|
| | | type | amount (mol %) | proportion of structural unit (mol %) | type | amount (mol %) | proportion of structural unit (mol %) | type | amount (mol %) | proportion of structural unit (mol %) | | | |
| Synthesis Example 10 | E-1 | M-5 | 50 | 49 | M-1 | 50 | 51 | — | — | — | 75 | 5,300 | 1.32 |
| Synthesis Example 11 | E-2 | M-5 | 50 | 49 | M-2 | 50 | 51 | — | — | — | 72 | 5,400 | 1.34 |
| Synthesis Example 12 | E-3 | M-5 | 50 | 49 | M-3 | 50 | 51 | — | — | — | 76 | 5,100 | 1.31 |
| Synthesis Example 13 | E-4 | M-5 | 50 | 48 | M-4 | 50 | 52 | — | — | — | 70 | 5,400 | 1.36 |
| Synthesis Example 14 | E-5 | M-6 | 50 | 47 | M-1 | 50 | 53 | — | — | — | 72 | 4,900 | 1.29 |
| Synthesis Example 15 | E-6 | M-5 M-7 | 45 10 | 44 10 | M-1 | 45 | 46 | — | — | — | 76 | 5,400 | 1.33 |
| Synthesis Example 16 | E-7 | M-5 M-8 | 50 10 | 49 10 | M-1 | 40 | 41 | — | — | — | 75 | 5,500 | 1.36 |
| Synthesis Example 17 | E-8 | M-6 M-9 | 45 10 | 41 11 | M-1 | 45 | 48 | — | — | — | 73 | 5,200 | 1.33 |
| Synthesis Example 18 | E-9 | M-5 | 50 | 49 | M-1 | 40 | 41 | M-10 | 10 | 10 | 76 | 5,300 | 1.32 |
| Synthesis Example 19 | E-10 | M-5 | 50 | 49.9 | M-17 | 50 | 50.1 | — | — | — | 75 | 5,300 | 1.34 |

TABLE 2-continued

| (E) Polymer | Monomer giving structural unit (II) | | | Monomer giving structural unit (III) | | | Monomer giving other structural unit | | | Yield (%) | Mw | Mw/Mn |
|---|---|---|---|---|---|---|---|---|---|---|---|---|
| | type | amount (mol %) | proportion of structural unit (mol %) | type | amount (mol %) | proportion of structural unit (mol %) | type | amount (mol %) | proportion of structural unit (mol %) | | | |
| Synthesis Example 20 | E-11 | M-5 | 50 | 49.7 | M-1 M-18 | 30 20 | 50.3 | — | — | — | 74 | 5,400 | 1.35 |
| Synthesis Example 21 | E-12 | M-5 | 50 | 49.8 | M-1 M-19 | 35 15 | 50.2 | — | — | — | 76 | 5,200 | 1.31 |
| Synthesis Example 22 | E-13 | M-5 | 40 | 39.7 | M-4 M-20 | 40 20 | 40.1 20.2 | — | — | — | 75 | 5,200 | 1.33 |
| Synthesis Example 23 | E-14 | M-5 | 50 | 49.5 | M-1 | 40 | 40.2 | M-21 | 10 | 10.3 | 73 | 5,300 | 1.33 |
| Synthesis Example 24 | E-15 | M-5 | 45 | 45.1 | M-4 | 35 | 34.7 | M-22 | 20 | 20.2 | 71 | 5,400 | 1.32 |
| Synthesis Example 25 | E-16 | M-5 | 45 | 45.2 | M-4 | 35 | 34.7 | M-23 | 20 | 20.1 | 73 | 5,100 | 1.32 |

Preparation of Radiation-Sensitive Resin Composition

Components each constituting the radiation-sensitive resin composition, other than the fluorine atom-containing polymer (B) and the polymer (E), are shown below.

(A) Component

A-1: compound represented by the above formula (A-1)

A-2: compound represented by the above formula (A-2)

A-3: compound represented by the above formula (A-3)

a-1: triphenylsulfonium n-butyltrifluoromethylsulfonamide (compound represented by the following formula (a-1))

a-2: triphenylsulfonium 10-camphorsulfonate (compound represented by the following formula (a-2))

a-3: triphenylsulfonium salicylate (compound represented by the following formula (a-3))

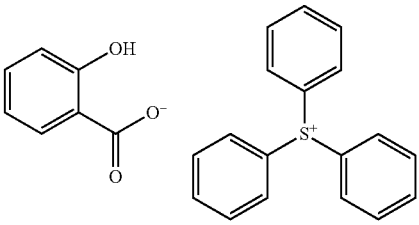

(C) Solvent

C-1: propylene glycol monomethyl ether acetate

C-2: cyclohexanone

C-3: γ-butyrolactone (D) Acid Generating Agent

D-1: triphenylsulfonium 4-(adamantan-1-ylcarbonyloxy)-1,1,2-trifluorobutane-1-sulfonate (compound represented by the following formula (D-1))

D-2: triphenylsulfonium adamantan-1-yloxycarbonyldifluoromethanesulfonate (compound represented by the following formula (D-2))

D-3: triphenylsulfonium 2-(adamantan-1-yl)-1,1-difluoroethane-1-sulfonate (compound represented by the following formula (D-3))

D-4: triphenylsulfonium 2-(adamantan-1-ylcarbonyloxy)-1,1,3,3,3-pentafluoropropane-1-sulfonate (compound represented by the following formula (D-4))

D-5: triphenylsulfonium norbornanesulton-2-yloxycarbonyl difluoromethanesulfonate (compound represented by the following formula (D-5))

D-6: triphenylsulfonium 3-(piperidin-1-ylsulfonyl-1,1,2,2,3,3-hexafluoropropane-1-sulfonate (compound represented by the following formula (D-6))

D-7: triphenylsulfonium hexafluoropropanesulfonimide (compound represented by the following formula (D-7))

D-8: triphenylsulfonium 2-(5,6-(adamantane-2,2-dioxy) norbornan-2-yl)-1,1,2,2-tetrafluoroethane-1-sulfonate (compound represented by the following formula (D-8))

D-9: triphenylsulfonium 1-(adamantan-yl)-succinimide-3-sulfonate (compound represented by the following formula (D-9))

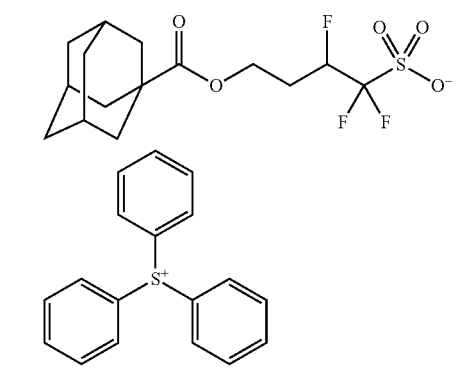
(D-1)
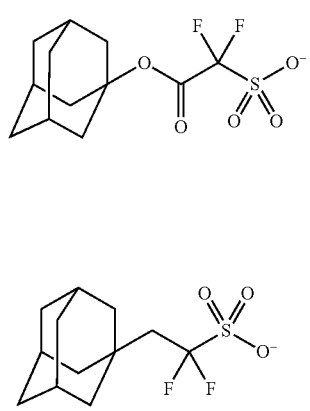
(D-2)
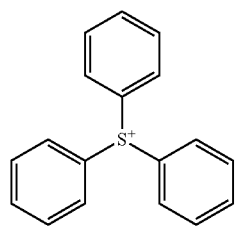
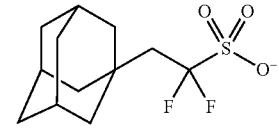
(D-3)
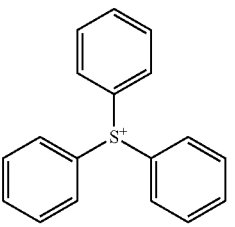
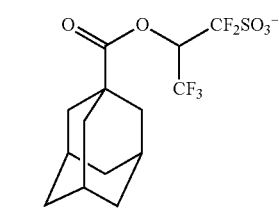
(D-4)
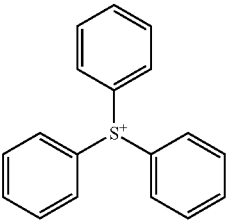
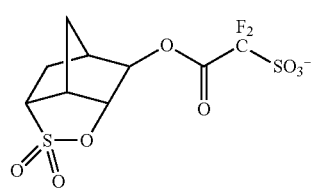
(D-5)
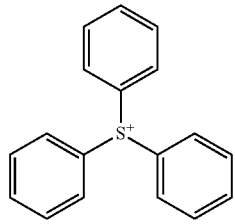
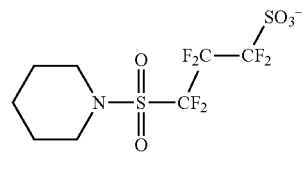
(D-6)
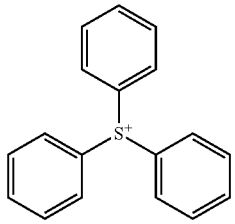
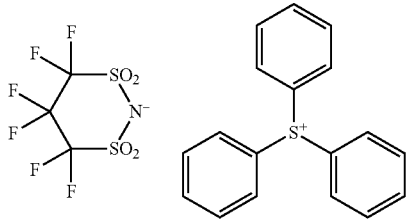
(D-7)
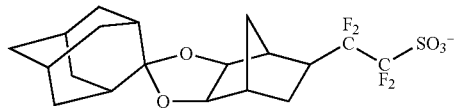
(D-8)
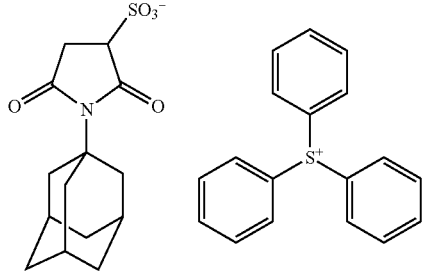
(D-9)
(F) Other Acid Diffusion Control Agent
F-1: N-(undecylcarbonyloxyethyl)morpholine (compound represented by the following formula (F-1))
F-2: N-t-butoxycarbonyl-4-hydroxypiperidine (compound represented by the following formula (F-2))
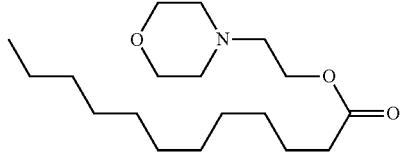
(F-1)
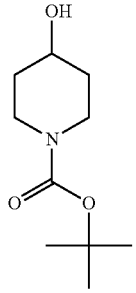
(F-2)

Example 1

A radiation-sensitive resin composition (J-1) was prepared by mixing 7 parts by mass of (A-1) as the compound (A), 3 parts by mass of (B-1) as the fluorine atom-containing polymer (B), 2,427 parts by mass of (C-1), 1,040 parts by mass of (C-2) and 200 parts by mass of (C-3) each as the solvent (C), 10 parts by mass of (D-1) as the acid generating agent (D), and 100 parts by mass of (E-1) as the polymer (E), and subjecting the mixture to filtration through a 0.2 μm membrane filter. The solid content concentration of the radiation-sensitive resin composition (J-1) was 3.3% by mass.

Examples 2 to 35 and Comparative Examples 1 to 8

Radiation-sensitive resin compositions (J-2) to (J-35) and (CJ-1) to (CJ-8) were prepared in a similar manner to Example 1 except that each component of the type and the content shown in Tables 3 and 4 was used. Values of the solid content concentration (% by mass) of each radiation-sensitive resin composition thus prepared were shown in Tables 3 and 4 in all. The symbol "-" in Tables 3 and 4 indicates that the relevant component was not used.

TABLE 3

| | Radiation-sensitive resin composition | (A) Component type | (A) content (parts by mass) | (B) Polymer type | (B) content (parts by mass) | (C) Solvent type | (C) content (parts by mass) |
|---|---|---|---|---|---|---|---|
| Example 1 | J-1 | A-1 | 7 | B-1 | 3 | C-1/C-2/C-3 | 2,427/1,040/200 |
| Example 2 | J-2 | A-1 | 7 | B-2 | 3 | C-1/C-2/C-3 | 2,427/1,040/200 |
| Example 3 | J-3 | A-1 | 7 | B-3 | 3 | C-1/C-2/C-3 | 2,427/1,040/200 |
| Example 4 | J-4 | A-1 | 7 | B-4 | 3 | C-1/C-2/C-3 | 2,427/1,040/200 |
| Example 5 | J-5 | A-1 | 7 | B-5 | 3 | C-1/C-2/C-3 | 2,427/1,040/200 |
| Example 6 | J-6 | A-1 | 7 | B-1 | 3 | C-1/C-2/C-3 | 2,427/1,040/200 |
| Example 7 | J-7 | A-1 | 7 | B-1 | 3 | C-1/C-2/C-3 | 2,427/1,040/200 |
| Example 8 | J-8 | A-1 | 7 | B-1 | 3 | C-1/C-2/C-3 | 2,427/1,040/200 |
| Example 9 | J-9 | A-1 | 7 | B-1 | 3 | C-1/C-2/C-3 | 2,427/1,040/200 |
| Example 10 | J-10 | A-1 | 7 | B-1 | 3 | C-1/C-2/C-3 | 2,427/1,040/200 |
| Example 11 | J-11 | A-1 | 7 | B-1 | 3 | C-1/C-2/C-3 | 2,427/1,040/200 |
| Example 12 | J-12 | A-1 | 7 | B-1 | 3 | C-1/C-2/C-3 | 2,427/1,040/200 |
| Example 13 | J-13 | A-1 | 7 | B-1 | 3 | C-1/C-2/C-3 | 2,427/1,040/200 |
| Example 14 | J-14 | A-1 | 7 | B-1 | 3 | C-1/C-2/C-3 | 2,427/1,040/200 |
| Example 15 | J-15 | A-1 | 7 | B-1 | 3 | C-1/C-2/C-3 | 2,427/1,040/200 |
| Example 16 | J-16 | A-2 | 8.4 | B-1 | 3 | C-1/C-2/C-3 | 2,427/1,040/200 |
| Example 17 | J-17 | A-3 | 9.2 | B-1 | 3 | C-1/C-2/C-3 | 2,427/1,040/200 |
| Example 18 | J-18 | A-1 | 7 | B-6 | 3 | C-1/C-2/C-3 | 2,427/1,040/200 |
| Example 19 | J-19 | A-1 | 7 | B-1 | 3 | C-1/C-2/C-3 | 2,427/1,040/200 |
| Example 20 | J-20 | A-1 | 7 | B-1 | 3 | C-1/C-2/C-3 | 2,427/1,040/200 |
| Example 21 | J-21 | A-1 | 7 | B-1 | 3 | C-1/C-2/C-3 | 2,427/1,040/200 |
| Example 22 | J-22 | A-1 | 7 | B-1 | 3 | C-1/C-2/C-3 | 2,427/1,040/200 |
| Example 23 | J-23 | A-1 | 7 | B-1 | 3 | C-1/C-2/C-3 | 2,427/1,040/200 |
| Example 24 | J-24 | A-1 | 7 | B-1 | 3 | C-1/C-2/C-3 | 2,427/1,040/200 |
| Example 25 | J-25 | A-1 | 7 | B-1 | 3 | C-1/C-2/C-3 | 2,427/1,040/200 |

| | (D) Acid generating agent type | (D) content (parts by mass) | (E) Polymer type | (E) content (parts by mass) | (F) Other acid diffusion control agent type | (F) content (parts by mass) | Solid content concentration (% by mass) |
|---|---|---|---|---|---|---|---|
| Example 1 | D-1 | 10 | E-1 | 100 | — | — | 3.3 |
| Example 2 | D-1 | 10 | E-1 | 100 | — | — | 3.3 |
| Example 3 | D-1 | 10 | E-1 | 100 | — | — | 3.3 |
| Example 4 | D-1 | 10 | E-1 | 100 | — | — | 3.3 |
| Example 5 | D-1 | 10 | E-1 | 100 | — | — | 3.3 |
| Example 6 | D-1 | 10 | E-2 | 100 | — | — | 3.3 |
| Example 7 | D-1 | 10 | E-3 | 100 | — | — | 3.3 |
| Example 8 | D-1 | 10 | E-4 | 100 | — | — | 3.3 |
| Example 9 | D-1 | 10 | E-5 | 100 | — | — | 3.3 |
| Example 10 | D-1 | 10 | E-6 | 100 | — | — | 3.3 |
| Example 11 | D-1 | 10 | E-7 | 100 | — | — | 3.3 |
| Example 12 | D-1 | 10 | E-8 | 100 | — | — | 3.3 |
| Example 13 | D-1 | 10 | E-9 | 100 | — | — | 3.3 |
| Example 14 | D-2 | 9.1 | E-1 | 100 | — | — | 3.3 |
| Example 15 | D-3 | 8.6 | E-1 | 100 | — | — | 3.3 |
| Example 16 | D-1 | 10 | E-1 | 100 | — | — | 3.3 |
| Example 17 | D-1 | 10 | E-1 | 100 | — | — | 3.3 |
| Example 18 | D-1 | 10 | E-1 | 100 | — | — | 3.3 |
| Example 19 | D-1 | 10 | E-10 | 100 | — | — | 3.3 |
| Example 20 | D-1 | 10 | E-11 | 100 | — | — | 3.3 |
| Example 21 | D-1 | 10 | E-12 | 100 | — | — | 3.3 |
| Example 22 | D-1 | 10 | E-13 | 100 | — | — | 3.3 |
| Example 23 | D-1 | 10 | E-14 | 100 | — | — | 3.3 |
| Example 24 | D-1 | 10 | E-15 | 100 | — | — | 3.3 |
| Example 25 | D-1 | 10 | E-16 | 100 | — | — | 3.3 |

TABLE 4

| | Radiation-sensitive resin composition | (A) Component type | content (parts by mass) | (B) Polymer type | content (parts by mass) | (C) Solvent type | content (parts by mass) |
|---|---|---|---|---|---|---|---|
| Example 26 | J-26 | A-1 | 7 | B-1 | 3 | C-1/C-2/C-3 | 2,427/1,040/200 |
| Example 27 | J-27 | A-1 | 7 | B-1 | 3 | C-1/C-2/C-3 | 2,427/1,040/200 |
| Example 28 | J-28 | A-1 | 7 | B-1 | 3 | C-1/C-2/C-3 | 2,427/1,040/200 |
| Example 29 | J-29 | A-1 | 7 | B-1 | 3 | C-1/C-2/C-3 | 2,427/1,040/200 |
| Example 30 | J-30 | A-1 | 7 | B-1 | 3 | C-1/C-2/C-3 | 2,427/1,040/200 |
| Example 31 | J-31 | A-1 a-1 | 3.5 3.5 | B-1 | 3 | C-1/C-2/C-3 | 2,427/1,040/200 |
| Example 32 | J-32 | A-1 a-2 | 3.5 3.5 | B-1 | 3 | C-1/C-2/C-3 | 2,427/1,040/200 |
| Example 33 | J-33 | A-1 a-3 | 3.5 3.5 | B-1 | 3 | C-1/C-2/C-3 | 2,427/1,040/200 |
| Example 34 | J-34 | A-1 | 3.5 | B-1 | 3 | C-1/C-2/C-3 | 2,427/1,040/200 |
| Example 35 | J-35 | A-1 | 3.5 | B-1 | 3 | C-1/C-2/C-3 | 2,427/1,040/200 |
| Comparative Example 1 | CJ-1 | a-1 | 7 | B-1 | 3 | C-1/C-2/C-3 | 2,427/1,040/200 |
| Comparative Example 2 | CJ-2 | a-1 | 7 | B-2 | 3 | C-1/C-2/C-3 | 2,427/1,040/200 |
| Comparative Example 3 | CJ-3 | a-1 | 7 | B-3 | 3 | C-1/C-2/C-3 | 2,427/1,040/200 |
| Comparative Example 4 | CJ-4 | a-1 | 7 | B-4 | 3 | C-1/C-2/C-3 | 2,427/1,040/200 |
| Comparative Example 5 | CJ-5 | a-1 | 7 | B-5 | 3 | C-1/C-2/C-3 | 2,427/1,040/200 |
| Comparative Example 6 | CJ-6 | a-1 | 7.7 | B-1 | 3 | C-1/C-2/C-3 | 2,427/1,040/200 |
| Comparative Example 7 | CJ-7 | a-2 | 8.1 | B-1 | 3 | C-1/C-2/C-3 | 2,427/1,040/200 |
| Comparative Example 8 | CJ-8 | a-3 | 6.6 | B-1 | 3 | C-1/C-2/C-3 | 2,427/1,040/200 |

| | (D) Acid generating agent type | content (parts by mass) | (E) Polymer type | content (parts by mass) | (F) Other acid diffusion control agent type | content (parts by mass) | Solid content concentration (% by mass) |
|---|---|---|---|---|---|---|---|
| Example 26 | D-4 | 10.3 | E-1 | 100 | — | — | 3.3 |
| Example 27 | D-5 | 9.65 | E-1 | 100 | — | — | 3.3 |
| Example 28 | D-6 | 10.1 | E-1 | 100 | — | — | 3.3 |
| Example 29 | D-7 | 8.78 | E-1 | 100 | — | — | 3.3 |
| Example 30 | D-8 | 11.2 | E-1 | 100 | — | — | 3.3 |
| Example 31 | D-1 | 10 | E-1 | 100 | — | — | 3.3 |
| Example 32 | D-1 | 10 | E-1 | 100 | — | — | 3.3 |
| Example 33 | D-1 | 10 | E-1 | 100 | — | — | 3.3 |
| Example 34 | D-1 | 10 | E-1 | 100 | F-1 | 3.5 | 3.3 |
| Example 35 | D-1 | 10 | E-1 | 100 | F-2 | 3.5 | 3.3 |
| Comparative Example 1 | D-1 | 10 | E-1 | 100 | — | — | 3.3 |
| Comparative Example 2 | D-1 | 10 | E-1 | 100 | — | — | 3.3 |
| Comparative Example 3 | D-1 | 10 | E-1 | 100 | — | — | 3.3 |
| Comparative Example 4 | D-1 | 10 | E-1 | 100 | — | — | 3.3 |
| Comparative Example 5 | D-1 | 10 | E-1 | 100 | — | — | 3.3 |
| Comparative Example 6 | D-1 | 10 | E-1 | 100 | — | — | 3.3 |
| Comparative Example 7 | D-1 | 10 | E-1 | 100 | — | — | 3.3 |
| Comparative Example 8 | D-1 | 10 | E-1 | 100 | — | — | 3.3 |

Evaluations

The evaluation of the storage stability and the development defect inhibitory ability was made on the radiation-sensitive resin compositions obtained above in accordance with the following methods. The results of the evaluations are shown in Tables 5 and 6.

Storage Stability

Two samples of each radiation-sensitive resin composition obtained in Examples 1 to 5 and Comparative Examples 1 to 5 were prepared, and each sample was stored at 5° C. or 35° C. for 2 weeks. Each solution obtained after the storage was coated on an 8-inch silicon wafer, and subjected to soft baking (SB) at 120° C. for 60 sec to provide a coating film having a film thickness of 80 nm. On the surface of the coating film provided, a receding contact angle was measured in accordance with the following procedure using a contact angle measurement apparatus ("DSA-10" supplied by KRUSS GmbH), under an environment involving a room temperature of 23° C., a humidity of 45% and an ordinary pressure.

A needle of DSA-10 was washed with acetone and isopropyl alcohol before the measurement, and subsequently water was drawn into the needle and a wafer was placed on a wafer stage. Thereafter, the elevational position of the stage was adjusted such that a distance between the surface of the wafer and the tip of the needle was no greater than 1 mm. Water was discharged from the needle to form a 25 μL water droplet on the wafer, and thereafter the water droplet was withdrawn through the needle at a rate of 10 μL/min for 180 sec during which a contact angle was concurrently measured once per second (180 times in total). Then, 20 contact angle measurements in total acquired after the time point when the contact angle became stable were averaged, and the averaged value was designated as a receding contact angle (°). The storage stability was evaluated to be "A" in the case of the difference of the receding contact angle between the sample stored at 5° C. and the sample stored at 35° C. being less than 1°, and to be "B" in the case of the difference of the receding contact angle being no less than 10°.

Development Defect Inhibitory Ability

A resist film having a film thickness of 75 nm was provided on a 12-inch silicon wafer on which an underlayer antireflective film ("ARC66" supplied by Nissan Chemical Industries, Ltd.) was provided, by coating each of the radiation-sensitive resin compositions obtained in Example 1 and Examples 6 to 18 as well as Comparative Examples 1, 7 and 8 on the 12-inch silicon wafer, and subjecting the radiation-sensitive resin composition to SB at 120° C. for 60 sec. Next, the resist film was exposed through a line-and-space (1L/1S) mask pattern with a target size of a width of 45 nm using an ArF excimer laser Immersion Scanner ("NSR-S610C" supplied by NIKON Corporation) under conditions involving NA of 1.3, a ratio of 0.750, and crosspole. After the exposure, PEB was carried out at the PEB temperature (° C.) shown in Table 6 below for 60 sec. Thereafter, the resist film was developed with a 2.38% by mass aqueous tetramethylammonium hydroxide solution for 60 sec using a GP nozzle of a development apparatus of CLEAN TRACK ("ACT12" supplied by Tokyo Electron Limited), and rinsed with pure water for 7 sec, followed by spin drying at 3,000 rpm to form a positive-type resist pattern. In this procedure, an exposure dose at which a 1L/1S pattern having a width of 45 nm was formed was designated as an optimum exposure dose. A 1L/1S pattern having a line width of 45 nm was formed on the entire surface of the wafer at the optimum exposure dose to prepare a wafer for inspection of defects. It is to be noted that a scanning electron microscope ("CC-4000" supplied by Hitachi High-Technologies Corporation) was used for the measurement. The number of defects on the wafer for inspection of defects obtained above was determined using an apparatus for inspection of defects ("KLA2810" supplied by KLA-Tencor Corporation). Furthermore, the defects detected using the apparatus for inspection of defects were classified into defects judged to be derived from the resist film and those resulting from foreign substances derived from the outside. After the classification, the total number of defects judged to be derived from the resist film was designated as the number of development defects. The development defect inhibitory ability was evaluated to be "A" in the case of the number of development defects being less than 10 per wafer, to be "B" in the case of the number of development defects being no less than 10 per wafer and less than 20 per wafer, and to be "C" in the case of the number of development defects being no less than 20 per wafer.

TABLE 5

| | Radiation-sensitive resin composition | Storage stability |
|---|---|---|
| Example 1 | J-1 | A |
| Example 2 | J-2 | A |
| Example 3 | J-3 | A |
| Example 4 | J-4 | A |
| Example 5 | J-5 | A |
| Comparative Example 1 | CJ-1 | B |
| Comparative Example 2 | CJ-2 | B |
| Comparative Example 3 | CJ-3 | B |
| Comparative Example 4 | CJ-4 | B |
| Comparative Example 5 | CJ-5 | B |

TABLE 6

| | Radiation-sensitive resin composition | PEB temperature (° C.) | Development defect inhibitory ability |
|---|---|---|---|
| Example 1 | J-1 | 100 | A |
| Example 6 | J-6 | 100 | A |
| Example 7 | J-7 | 100 | A |
| Example 8 | J-8 | 100 | A |
| Example 9 | J-9 | 85 | A |
| Example 10 | J-10 | 105 | A |
| Example 11 | J-11 | 100 | A |
| Example 12 | J-12 | 80 | A |
| Example 13 | J-13 | 110 | A |
| Example 14 | J-14 | 105 | A |
| Example 15 | J-15 | 110 | A |
| Example 16 | J-16 | 100 | A |
| Example 17 | J-17 | 100 | A |
| Example 18 | J-18 | 100 | B |
| Comparative Example 1 | CJ-1 | 100 | C |
| Comparative Example 7 | CJ-7 | 100 | C |
| Comparative Example 8 | CJ-8 | 100 | C |

As is clear from the results shown in Tables 5 and 6, the radiation-sensitive resin composition of Examples exhibited superior storage stability and favorable development defect inhibitory ability. The radiation-sensitive resin compositions of Comparative Examples exhibited both unfavorable storage stability and unfavorable development defect inhibitory ability.

Formation of Resist Pattern
Formation of Resist Pattern (1): Development with Alkali An underlayer antireflective film having a film thickness of 105 nm was provided on the surface of a 12-inch silicon wafer by coating a composition for forming an underlayer antireflective film ("ARC66" supplied by Brewer Science) on the surface of the 12-inch silicon wafer using a spin coater ("CLEAN TRACK ACT12" supplied by Tokyo Electron Limited), and thereafter heating the composition for forming an underlayer antireflective film at 205° C. for 60 sec. Each radiation-sensitive resin composition prepared above was coated on the underlayer antireflective film using the spin coater, and subjected to SB at 90° C. for 60 sec. Thereafter, cooling was carried out at 23° C. for 30 sec to provide a resist film having a film thickness of 90 nm. Next, the resist film was exposed using an ArF excimer laser Immersion Scanner ("NSR-S610C" supplied by NIKON Corporation) through a mask pattern for forming a 40 nm line-and-space (1L1S) pattern under optical conditions involving NA of 1.3 and dipole (Sigma: 0.977/0.782). After the exposure, PEB was carried out at 90° C. for 60 sec. Thereafter, a development with an alkali was carried out using a 2.38% by mass aqueous TMAH solution as an alkaline developer solution, followed by washing with water and drying to form a positive-type resist pattern. In the resist pattern formation, an exposure dose at which a line-and-space of 1:1 with a line width of 40 nm was formed through a mask for a line-and-space of 1:1 with a target dimension of 40 nm was designated as an optimum exposure dose (Eop).

Formation of Resist Pattern (2): Development with Organic Solvent

A negative-type resist pattern was formed in a similar manner to the abovementioned "Formation of Resist Pattern (1)" except that a development with an organic solvent was carried out using n-butyl acetate in place of the aqueous TMAH solution and the washing with water was skipped.

Evaluations

The LWR performance, the CDU performance, the resolving ability, the rectangularity of a cross-sectional shape, the depth of focus, the exposure latitude and the MEEF performance of the radiation-sensitive resin composition were evaluated by making measurements on the resist pattern formed above in accordance with the following methods. The results of the evaluations are shown in Table 7. In regard to the evaluations of the LWR performance, the CDU performance, the resolving ability, the depth of focus, the exposure latitude and the MEEF performance, comparisons were made on: Examples 1, 6 to 17 and 19 to 35 with Comparative Example 1; Example 2 with Comparative Example 2; Example 3 with Comparative Example 3; Example 4 with Comparative Example 4; and Examples 5 and 18 with Comparative Example 5.

LWR Performance

A resist pattern formed by irradiation at an exposure dose of the Eop was observed from above the pattern using the scanning electron microscope. The line width was measured at arbitrary points of 50 in total, then a 3 Sigma value was determined from the distribution of the measurements, and the value was designated as LWR performance. The smaller value indicates a small distortion of lines and hence a more favorable LWR performance. The LWR performance was evaluated to be "A" (favorable) in the case of an improvement by no less than 10% being found when a value was compared with that for Comparative Example (which means a value indicative of the LWR performance being no greater than 90% of the value for Comparative Example), and to be "B" (unfavorable) in the case of an improvement by less than 10% being found (which means a value indicative of the LWR performance being greater than 90% of the value for Comparative Example).

CDU Performance

The resist pattern formed by irradiation at an exposure dose of the Eop was observed from above the pattern using the scanning electron microscope. The line width was measured at 20 points within a range of 400 nm and the measurements were averaged, then such an averaged value was determined at arbitrary points of 500 in total, then a 3 Sigma value was determined from the distribution of the averaged values, and the 3 Sigma value was designated as a CDU performance. The smaller value indicates a small long-term variation of the line width and hence a more favorable CDU performance. The CDU performance was evaluated to be "A" (favorable) in the case of an improvement by no less than 10% being found when a value was compared with that for Comparative Example (which means a value indicative of the CDU performance being no greater than 90% of the value for Comparative Example), and to be "B" (unfavorable) in the case of an improvement by less than 10% being found (which means a value indicative of the CDU performance being greater than 90% of the value for Comparative Example).

Resolving Ability

A dimension of the minimum resist pattern which was resolved by irradiation at an exposure dose of the Eop was measured, and the measurement value was designated as a resolving ability. The smaller value indicates the possibility of forming a finer pattern, and hence a more favorable resolving ability. The resolving ability was evaluated to be "A" (favorable) in the case of an improvement by no less than 10% being found when a value was compared with that for Comparative Example (which means a value indicative of the resolving ability being no greater than 90% of the value for Comparative Example), and to be "B" (unfavorable) in the case of an improvement by less than 10% being found (which means a value indicative of the resolving ability being greater than 90% of value for Comparative Example).

Rectangularity of Cross-Sectional Shape

The cross-sectional shape of the resist pattern which was resolved by irradiation at an exposure dose of the Eop was observed, and a line width Lb in the middle portion along an altitude direction of the resist pattern and a line width La at the top of the resist pattern were measured. The value more approximate to 1 indicates a more rectangular resist pattern, and hence more favorable rectangularity of a cross-sectional shape. The rectangularity of a cross-sectional shape was evaluated to be "A" (favorable) in a case where the La/Lb value fell within a range of no less than 0.9 and no greater than 1.1, and to be "B" (unfavorable) in a case where the La/Lb value was less than 0.9 or greater than 1.1.

Depth of Focus

On the resist pattern which was resolved by irradiation at an exposure dose of the Eop, the dimension when the focus was shifted along the depth direction was observed, and a latitude in the depth direction in which the pattern dimension fell within the range of 90% to 110% of the reference while not accompanied by a bridge and/or a residue was measured, and the measurement value was designated as a depth of focus. The greater value of the depth of focus indicates a smaller variation of the dimension of the pattern obtained when the position of the focal point is varied, and leads to the possibility that a process yield in the production of devices can be increased. The depth of focus was evaluated to be "A" (favorable) in the case of an improvement by no less than 10% being found when the value was compared with that for Comparative Example (which means a value indicative of the depth of focus being no less than 110% of a value for Comparative Example), and to be "B" (unfavorable) in the case of an improvement by less than 10% being found (which means a value indicative of the depth of focus being less than 110% of a value for Comparative Example).

Exposure Latitude

An exposure dose was changed in 1 mJ/cm$^2$ increments within a range of exposure dose covering the Eop, a resist pattern was formed at every exposure dose, and the line width of each resist pattern was measured using the scanning electron microscope. From the relationship between the resulting line width and the exposure dose, an exposure dose E(44) at which a line width of 44 nm was attained and an exposure dose E(36) at which a line width of 36 nm was attained were determined, and an exposure latitude (%) was calculated in accordance with the equation of:

exposure latitude=($E$(36)−$E$(44))×100/(optimum exposure dose).

The greater value of the exposure latitude indicates that a smaller variation of the dimension of the pattern obtained is attained when the exposure dose is varied, and leads to the possibility that a process yield in the production of devices can be increased. The exposure latitude was evaluated to be "A" (favorable) in the case of an improvement by no less than 10% being found when a value was compared with that for Comparative Example (which means a value indicative of the exposure latitude being no less than 110% of a value for Comparative Example), and to be "B" (unfavorable) in the case of an improvement by less than 10% being found (which means a value indicative of the exposure latitude being less than 110% of a value for Comparative Example).

MEEF Performance

In the resist pattern which was resolved by irradiation at an exposure dose of the Eop, the line width of the resist pattern formed using each mask pattern to give a line width of 38 nm, 39 nm, 40 nm, 41 nm and 42 nm was plotted along the ordinate with respect to the size of the mask pattern along the abscissa, and the slope of the resulting straight line was calculated. The slope was designated as a MEEF performance. The value of the MEEF performance more approximate to 1 indicates more favorable mask reproducibility. The MEEF performance was evaluated to be "A" (favorable) in the case of an improvement by no less than 10% being found when a value was compared with that for Comparative Example (which means a value indicative of the MEEF performance being no greater than 90% of the value for Comparative Example), and to be "B" (unfavorable) in the case of an improvement by less than 10% being found (which means a value indicative of the MEEF performance being greater than 90% of value for Comparative Example).

TABLE 7

| | Development with alkali (formation of resist pattern (1)) | | | | | | |
|---|---|---|---|---|---|---|---|
| | LWR performance | CDU performance | resolving ability | rectangularity of cross-sectional shape | depth of focus | exposure latitude | MEEF performance |
| Example 1 | A | A | A | A | A | A | A |
| Example 2 | A | A | A | A | A | A | A |
| Example 3 | A | A | A | A | A | A | A |
| Example 4 | A | A | A | A | A | A | A |
| Example 5 | A | A | A | A | A | A | A |
| Example 6 | A | A | A | A | A | A | A |
| Example 7 | A | A | A | A | A | A | A |
| Example 8 | A | A | A | A | A | A | A |
| Example 9 | A | A | A | A | A | A | A |
| Example 10 | A | A | A | A | A | A | A |
| Example 11 | A | A | A | A | A | A | A |
| Example 12 | A | A | A | A | A | A | A |
| Example 13 | A | A | A | A | A | A | A |
| Example 14 | A | A | A | A | A | A | A |
| Example 15 | A | A | A | A | A | A | A |
| Example 16 | A | A | A | A | A | A | A |
| Example 17 | A | A | A | A | A | A | A |
| Example 18 | A | A | A | A | A | A | A |
| Example 19 | A | A | A | A | A | A | A |
| Example 20 | A | A | A | A | A | A | A |
| Example 21 | A | A | A | A | A | A | A |
| Example 22 | A | A | A | A | A | A | A |
| Example 23 | A | A | A | A | A | A | A |
| Example 24 | A | A | A | A | A | A | A |
| Example 25 | A | A | A | A | A | A | A |
| Example 26 | A | A | A | A | A | A | A |
| Example 27 | A | A | A | A | A | A | A |
| Example 28 | A | A | A | A | A | A | A |
| Example 29 | A | A | A | A | A | A | A |
| Example 30 | A | A | A | A | A | A | A |
| Example 31 | A | A | A | A | A | A | A |
| Example 32 | A | A | A | A | A | A | A |
| Example 33 | A | A | A | A | A | A | A |
| Example 34 | A | A | A | A | A | A | A |
| Example 35 | A | A | A | A | A | A | A |
| Comparative Example 1 | — | — | — | B | — | — | — |
| Comparative Example 2 | — | — | — | B | — | — | — |
| Comparative Example 3 | — | — | — | B | — | — | — |
| Comparative Example 4 | — | — | — | B | — | — | — |
| Comparative Example 5 | — | — | — | B | — | — | — |
| Comparative Example 6 | — | — | — | B | — | — | — |

TABLE 7-continued

| | | | | | | | |
|---|---|---|---|---|---|---|---|
| Comparative Example 7 | — | — | — | B | — | — | — |
| Comparative Example 8 | — | — | — | B | — | — | — |

| | Development with organic solvent (formation of resist pattern (2)) | | | | | | |
|---|---|---|---|---|---|---|---|
| | LWR performance | CDU performance | resolving ability | rectangularity of cross-sectional shape | depth of focus | exposure latitude | MEEF performance |
| Example 1 | A | A | A | A | A | A | A |
| Example 2 | A | A | A | A | A | A | A |
| Example 3 | A | A | A | A | A | A | A |
| Example 4 | A | A | A | A | A | A | A |
| Example 5 | A | A | A | A | A | A | A |
| Example 6 | A | A | A | A | A | A | A |
| Example 7 | A | A | A | A | A | A | A |
| Example 8 | A | A | A | A | A | A | A |
| Example 9 | A | A | A | A | A | A | A |
| Example 10 | A | A | A | A | A | A | A |
| Example 11 | A | A | A | A | A | A | A |
| Example 12 | A | A | A | A | A | A | A |
| Example 13 | A | A | A | A | A | A | A |
| Example 14 | A | A | A | A | A | A | A |
| Example 15 | A | A | A | A | A | A | A |
| Example 16 | A | A | A | A | A | A | A |
| Example 17 | A | A | A | A | A | A | A |
| Example 18 | A | A | A | A | A | A | A |
| Example 19 | A | A | A | A | A | A | A |
| Example 20 | A | A | A | A | A | A | A |
| Example 21 | A | A | A | A | A | A | A |
| Example 22 | A | A | A | A | A | A | A |
| Example 23 | A | A | A | A | A | A | A |
| Example 24 | A | A | A | A | A | A | A |
| Example 25 | A | A | A | A | A | A | A |
| Example 26 | A | A | A | A | A | A | A |
| Example 27 | A | A | A | A | A | A | A |
| Example 28 | A | A | A | A | A | A | A |
| Example 29 | A | A | A | A | A | A | A |
| Example 30 | A | A | A | A | A | A | A |
| Example 31 | A | A | A | A | A | A | A |
| Example 32 | A | A | A | A | A | A | A |
| Example 33 | A | A | A | A | A | A | A |
| Example 34 | A | A | A | A | A | A | A |
| Example 35 | A | A | A | A | A | A | A |
| Comparative Example 1 | — | — | — | B | — | — | — |
| Comparative Example 2 | — | — | — | B | — | — | — |
| Comparative Example 3 | — | — | — | B | — | — | — |
| Comparative Example 4 | — | — | — | B | — | — | — |
| Comparative Example 5 | — | — | — | B | — | — | — |
| Comparative Example 6 | — | — | — | B | — | — | — |
| Comparative Example 7 | — | — | — | B | — | — | — |
| Comparative Example 8 | — | — | — | B | — | — | — |

As is clear from the results shown in Table 7, in both cases of the development with an alkali and the development with an organic solvent, the radiation-sensitive resin compositions of Examples exhibited sufficiently favorable LWR performance, CDU performance, resolving ability, depth of focus, exposure latitude and MEEF performance and favorable rectangularity of a cross-sectional shape as compared with the radiation-sensitive resin compositions of Comparative Examples. The radiation-sensitive resin compositions of Comparative Examples exhibited unfavorable rectangularity of a cross-sectional shape.

INDUSTRIAL APPLICABILITY

According to the radiation-sensitive resin composition and the resist pattern-forming method of the embodiments of the present invention, a resist pattern can be formed that exhibits less development defects, reduced LWR and CDU, increased resolving ability, and superior rectangularity of a cross-sectional shape while exhibiting favorable storage stability, depth of focus, exposure latitude and MEEF performance. Therefore, these can be suitably used in pattern formation involved in the production of semiconductor devices and the like, in which further progress of miniaturization is expected.

The invention claimed is:

1. A radiation-sensitive resin composition comprising:
a compound represented by formula (1b);
a first polymer that comprises a fluorine atom, an acid-labile group, and an alkali-labile group;
a second polymer that comprises an acid-labile group and either is unfluorinated or has a content of fluorine atoms less than a content of fluorine atoms of the first polymer;
a radiation-sensitive acid generator; and
a solvent,

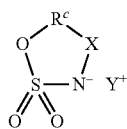

(1b)

wherein in the formula (1b),
X represents a carbonyl group;
$Y^+$ represents a monovalent radiation-degradable onium cation; and
$R^c$ represents an alkenediyl group having 2 to 20 carbon atoms,
wherein at least one of the first polymer and the second polymer comprises a structural unit represented by formula (2):

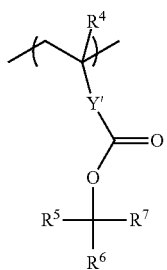

(2)

wherein in the above formula (2),
$R^4$ represents a hydrogen atom, a fluorine atom, a methyl group or a trifluoromethyl group;
Y' represents a carbonyloxyalkanediyl group having 2 to 20 carbon atoms, a carbonyloxycycloalkanediyl group having 4 to 20 carbon atoms, or a carbonyloxycycloalkanediyloxy group having 4 to 20 carbon atoms;
$R^5$ represents a hydrogen atom or a monovalent linear or branched hydrocarbon group having 1 to 10 carbon atoms; and
$R^6$ and $R^7$ each independently represent a monovalent linear or branched hydrocarbon group having 1 to 20 carbon atoms or a monovalent alicyclic hydrocarbon group having 3 to 20 carbon atoms, or $R^6$ and $R^7$ taken together represent an alicyclic structure having 3 to 20 ring atoms together with the carbon atom to which $R^6$ and $R^7$ bond.

2. The radiation-sensitive resin composition according to claim 1, wherein the first polymer comprises a structural unit represented by formula (2a), a structural unit represented by formula (2b), or both of the same,

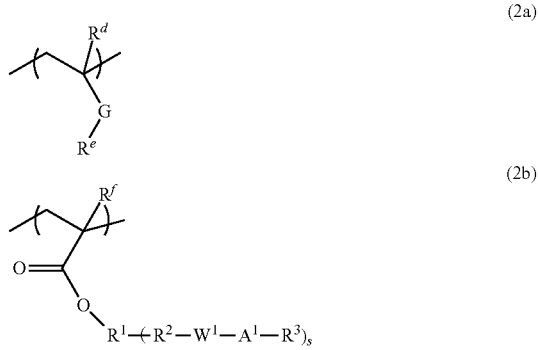

wherein in the formula (2a),
$R^d$ represents a hydrogen atom, a methyl group or a trifluoromethyl group;
G represents a single bond, an oxygen atom, a sulfur atom, —CO—O—, —SO$_2$—O—NH—, —CO—NH— or —O—CO—NH—; and
$R^e$ represents a monovalent fluorinated linear or branched hydrocarbon group having 1 to 6 carbon atoms or a monovalent fluorinated alicyclic hydrocarbon group having 4 to 20 carbon atoms,
and wherein in the formula (2b),
$R^f$ represents a hydrogen atom, a methyl group or a trifluoromethyl group;
$R^1$ represents a hydrocarbon group having 1 to 20 carbon atoms and having a valency of (s+1), or the hydrocarbon group to which an oxygen atom, a sulfur atom, —NR'—, a carbonyl group, —CO—O— or —CO—NH— bonds at an end thereof on a side linking to $R^2$, wherein R' represents a hydrogen atom or a monovalent hydrocarbon group having 1 to 10 carbon atoms;
$R^2$ represents a single bond or a divalent organic group having 1 to 20 carbon atoms;
$W^1$ represents a single bond or a divalent fluorinated linear or branched hydrocarbon group having 1 to 20 carbon atoms;
$A^1$ represents an oxygen atom, —NR"—, —CO—O—* or —SO$_2$—O—*, wherein R" represents a hydrogen atom or a monovalent hydrocarbon group having 1 to 10 carbon atoms, and wherein * denotes a biding site to $R^3$;

$R^3$ represents a hydrogen atom or a monovalent organic group having 1 to 30 carbon atoms; and s is an integer of 1 to 3, wherein in a case where s is 1, $R^1$ optionally represents a single bond, wherein in a case where s is 2 or 3, a plurality of $R^2$s are identical to or different from each other, a plurality of $W^1$s are identical to or different from each other, a plurality of $A^1$s are identical to or different from each other, and a plurality of $R^3$s are identical to or different from other, and wherein in a case where $W^1$ represents a single bond, $R^3$ represents a group that comprises a fluorine atom.

3. The radiation-sensitive resin composition according to claim 2, wherein $R^3$ in the formula (2b) represents the alkali-labile group.

4. The radiation-sensitive resin composition according to claim 3, wherein a proportion of the structural unit represented by the formula (2b) in the first polymer with respect to total structural units constituting the first polymer is 10 mol % to 90 mol %.

5. The radiation-sensitive resin composition according to claim 3, wherein a proportion of the structural unit represented by the formula (2b) in the first polymer with respect to total structural units constituting the first polymer is 40 mol % to 80 mol %.

6. A resist pattern-forming method comprising:
applying the radiation-sensitive resin composition according to claim 1 on a substrate to provide a resist film;
exposing the resist film through a liquid immersion medium; and
developing the resist film exposed through the liquid immersion medium.

7. The radiation-sensitive resin composition according to claim 1, wherein a content of the compound with respect to a total solid content of the radiation-sensitive resin composition is from 0.1% by mass to 30% by mass.

8. The radiation-sensitive resin composition according to claim 1, wherein a content of the compound with respect to a total solid content of the radiation-sensitive resin composition is from 3% by mass to 10% by mass.

9. The radiation-sensitive resin composition according to claim 1, wherein a content of the first polymer with respect to 100 parts by mass of the compound is from 5 parts by mass to 2000 parts by mass.

10. The radiation-sensitive resin composition according to claim 1, wherein a content of the first polymer with respect to 100 parts by mass of the compound is from 25 parts by mass to 70 parts by mass.

11. The radiation-sensitive resin composition according to claim 1, wherein in the formula (1b), $R^c$ represents an alkenediyl group having 3 or 4 carbon atoms.

12. The radiation-sensitive resin composition according to claim 1, wherein in the formula (1b), $R^c$ represents 1,2-propenediyl group.

* * * * *